(12) United States Patent
Nogiwa et al.

(10) Patent No.: US 7,077,908 B2
(45) Date of Patent: Jul. 18, 2006

(54) SUBSTRATE HOLDER

(75) Inventors: Tatsuki Nogiwa, Hirakata (JP);
Hidehiko Uemura, Kuze-gun (JP);
Hironori Uemura, Kuze-gun (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/854,253

(22) Filed: May 27, 2004

(65) Prior Publication Data
US 2004/0238595 A1    Dec. 2, 2004

(30) Foreign Application Priority Data
May 30, 2003   (JP)   ............................. 2003-154936
Feb. 25, 2004  (JP)   ............................. 2004-049579

(51) Int. Cl.
*B05C 13/02*   (2006.01)
(52) U.S. Cl. .................. 118/500; 118/213; 118/301; 118/406; 269/903; 156/245
(58) Field of Classification Search ................ 118/500, 118/406, 301, 213; 427/282; 269/903; 228/49.5; 101/129, 126; 29/740; 156/245, 242
See application file for complete search history.

(56) References Cited

U.S. PATENT DOCUMENTS 5,366,573 A * 11/1994 Bayer et al. .................. 156/64

FOREIGN PATENT DOCUMENTS

| JP | 3-262194    | 11/1991  |
|----|-------------|----------|
| JP | 4-342196    | 11/1992  |
| JP | 2517040     | 4/1996   |
| JP | 2000-261193 | 9/2000   |
| JP | 2001-210998 | 8/2001   |
| JP | 3328248     | 7/2002   |
| JP | 2002-232197 | 8/2002   |
| JP | 2002-374062 | 12/2002  |
| JP | 3435157     | * 5/2003 |

* cited by examiner

*Primary Examiner*—Laura Edwards
(74) *Attorney, Agent, or Firm*—Wenderoth, Lind & Ponack, L.L.P.

(57) ABSTRACT

In a substrate holder for holding a circuit board onto which a viscous material for bonding electronic components is printed by use of a squeegee through a screen mask, a first holding area for holding the screen mask and a second holding area for holding the circuit board are provided on a base surface. The squeegee is supported by at least one of the first holding area and the second holding area. The squeegee is abutted against the circuit board being held to the second holding area, via the screen mask placed on the circuit board.

37 Claims, 21 Drawing Sheets

SUBSTRATE HOLDER

BACKGROUND OF THE INVENTION

1. Field of the Invention

The present invention relates to a technique for holding a circuit board. In particular, the invention relates to a technique for holding a flexible circuit board when mounting electronic components on the flexible circuit board. More particularly, the invention relates to a substrate holder for holding a flexible circuit board by adhesion.

2. Description of the Background Art

In recent years, sheet-like flexible printed circuit boards (hereinafter referred to as "FPCs") have been used in small electronic devices such as mobile phones, PDAs (Personal Data Assistants), and notebook-type computers. An FPC comprises a resin sheet having formed thereon various wiring patterns on which a variety of electronic components (e.g., ICs, capacitors, resistors, coils, and/or connectors) are mounted. By using an FPC in an electronic device, it is possible to flexibly dispose a circuit board in the electronic device and to downsize the electronic device.

The FPC, however, has a disadvantage in that it is difficult to handle by itself without any support, due to its flexibility. In particular, when mounting electronic components on an FPC, various processes are performed on a surface of the FPC, and thus it is essential to securely hold the FPC. In order to treat FPCs in the same manner as conventional plate-like circuit boards (e.g., circuit boards formed of glass epoxy resin or the like), conventionally, an FPC is fixed onto a plate having high stiffness with clamps.

Japanese Patent Laid-Open Publication No. 2002-232197 discloses a technique in which an adhesive layer is provided on a base plate of a pallet to allow an FPC to adhere thereto, whereby the FPC along with the base plate can be treated in the same manner as a conventional circuit board. In addition, Japanese Patent No. 3435157 describes a jig having adhesive layers formed thereon in a plurality of locations so that a plurality of FPCs are held to the adhesive layers.

When mounting electronic components on an FPC being adhered onto a base plate, the shape and/or tackiness of an adhesive region to be provided between the FPC and the base plate becomes important. For example, when mounting electronic components on an FPC, normally, various processes are performed on the FPC being adhered onto a base plate, which include screen-printing of solder paste, installation of electronic components, and reflow (heating and cooling). In a screen-printing apparatus for printing solder paste onto the FPC, a screen mask having provided therein openings to correspond to mounting locations of electronic components is placed on the FPC so as to be abutted against the FPC. Then, solder paste is applied onto the screen mask. The solder paste on the screen mask is pushed (squeegeed) by a squeegee against the FPC and filled in the openings of the screen mask, whereby the solder paste is printed on the FPC being abutted against the underside of the screen mask. After printing, the screen mask is gently lifted and removed from the FPC. In this manner, the solder paste is printed on the mounting locations of the electronic components of the FPC in desired patterns.

In this process, however, if an adhesive layer is formed to be larger than an FPC to be held, when a screen mask is placed on the FPC, a portion of the screen mask which is not being abutted against the FPC may be attached to the adhesive layer, causing the following problems. Specifically, a portion of the screen mask which is being abutted against the FPC is only being placed on the FPC, and thus can be removed from the FPC by lifting the screen mask without any resistance. On the other hand, a portion of the screen mask which is being attached to the adhesive layer is being securely adhered to the adhesive layer, and therefore when the screen mask is lifted, the screen mask is pulled by the adhesive layer and then deformed. Here, if the screen mask is further lifted, the screen mask will be eventually removed from the adhesive layer, however, the screen mask may be further deformed and swayed during the further lifting.

Due to the deformation and swaying of the screen mask, when the screen mask is removed from the FPC, the solder paste being filled in the printing openings may be damaged; as a result, the solder paste cannot be formed on the FPC in predetermined patterns. Accordingly, electronic components cannot be properly formed on circuits of the FPC. Further, under normal conditions of use in which the screen mask is gently lifted, the screen mask has durability and thus can be used repeatedly. However, deformation of the screen mask caused by the adhesive layer pulling the screen mask may cause deformation of the shape of the openings of the screen mask, which in turn makes it impossible to repeatedly use the screen mask. Thus, attachment of the screen mask to the adhesive layer is very inconvenient as it may cause degradation of mounting quality of electronic components and a reduction in yield.

To avoid the aforementioned problems, the screen mask needs to be prevented from attaching to an adhesive layer. For example, an adhesive layer may be provided only in a location of a pallet where an FPC is to be held. Specifically, an adhesive layer may be provided in a region of a base plate which is smaller than the outer shape of the FPC. In this method, in the case where a plurality of FPCs are held onto one pallet, independently-formed adhesive layer regions are provided to be greater in number than FPCs to be held, and to be spaced apart from each other. In this case, a depression (i.e., a height difference between the surface of the adhesive layer and the surface of the base plate) is generated between an adhesive layer region and a non-adhesive layer region on the base plate.

When performing printing on a plurality of FPCs being held onto the above-described pallet, the screen mask does not attach to the adhesive layers. However, the screen mask may be deformed at a depression between adhesive layers or at the outer edge of an adhesive layer. Specifically, when solder paste being applied onto the screen mask is pressed with a squeegee, the screen mask is also pressed on the base plate side through the solder paste, whereby the screen mask is greatly deformed at a depression between adhesive layers.

When the squeegee is moving across adhesive layer regions, the screen mask is being supported by adhesive layers, and thus deformation of the screen mask can be neglected. However, when the squeegee gets to a depression from an adhesive layer region, the screen mask loses its support at the outer edge of the adhesive layer region, whereby the screen mask sinks on the base plate side along with the squeegee and is then greatly deformed. While the squeegee is moving up to a depression, the screen mask may be deformed in conjunction with the movement of the squeegee. Thus, at the point when the squeegee has reached over the subsequent adhesive layer region, deformation of the screen mask has been accumulated at the outer edge of the subsequent adhesive layer region, and in the worst case the screen mask may be caught between the squeegee and the outer edge, thereby damaging the screen mask.

In addition to the damage to the screen mask, the printing operation of the squeegee may become unstable, depending on the depth of a depression (i.e., the thickness of an adhesive layer) and/or the size of a depression (i.e., the spacing distance between adhesive layers). Specifically, in the case where FPCs are held to adhesive layers which are provided only in the direction perpendicular to the moving direction of the squeegee, the squeegee and the screen mask are greatly sunk at the aforementioned depression, whereby the squeegee is tilted and the printing operation becomes unstable.

If the tackiness of an adhesive layer is low, an FPC cannot be held by adhesion due to an air pressure caused by hot air circulation during reflow. On the other hand, if the tackiness of an adhesive layer is high, especially in the case where the contact area between an adhesive material and an FPC is large, when peeling the FPC, a large force may be applied to the FPC; therefore, peeling cannot be performed properly, causing the same problems as the aforementioned problems caused when the screen mask is adhered to an adhesive layer.

SUMMARY OF THE INVENTION

In view of the foregoing problems, it is an object of the present invention to provide techniques for easily handling an object in the case where the object is being held by adhesion onto a circuit board or the like.

The present invention has the following features to attain the object mentioned above. A first aspect of the present invention is directed to a substrate holder for holding a circuit board onto which a viscous material for bonding electronic components is printed by means of a squeegee through a screen mask, the substrate holder comprising: a plate-like main body having a base surface; a first holding area provided on the base surface to hold the screen mask; and a second holding area provided on the base surface to hold the circuit board, wherein the squeegee is supported by at least one of the first holding area and the second holding area, the squeegee being abutted against the circuit board being held to the second holding area, via the screen mask placed on the circuit board.

These and other objects, features, aspects and advantages of the present invention will become more apparent from the following detailed description of the present invention when taken in conjunction with the accompanying drawings.

DESCRIPTION OF THE PREFERRED EMBODIMENTS

FIRST EMBODIMENT

Figure 1:
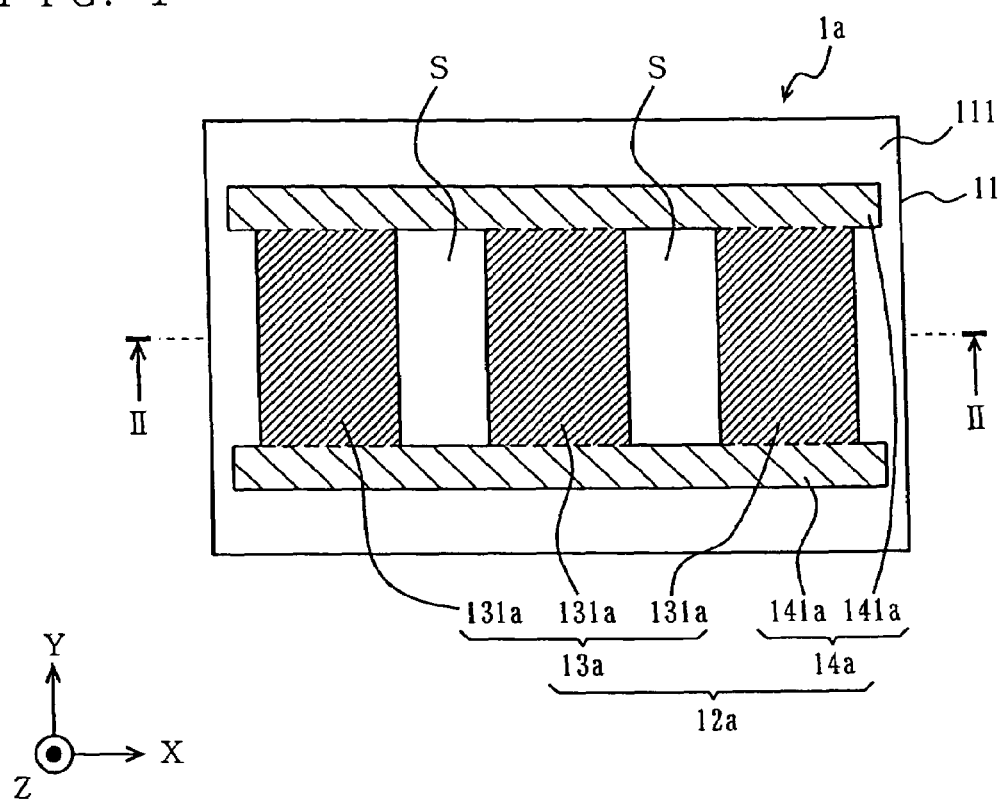
FIG. 1 is a plan view of a pallet according to a first embodiment of the present invention.
Figure 2:
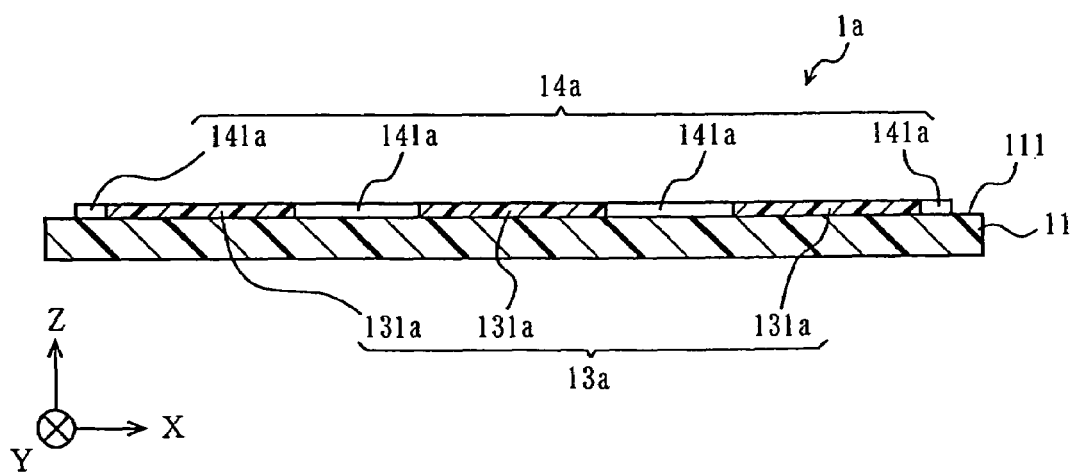
FIG. 2 is a cross-sectional view of the pallet taken along a line II—II of FIG. 1.

Referring to FIGS. 1 to 8, there is described a pallet 1a which serves as a substrate holder for carrying FPCs according to a first embodiment of the present invention. FIG. 1 is a top view of a surface (hereinafter referred to as an "FPC-holding surface") of a pallet onto which FPCs are held. FIG. 2 is a cross-sectional view of the pallet 1a taken along a line II—II of FIG. 1. Note that in FIGS. 1 and 2 the X and Y axes respectively indicate two directions which define an FPC-holding surface of the pallet 1a, and the Z axis indicates a direction perpendicular to the FPC-holding surface. That is, the X and Y axes define the size of the FPC-holding surface or a surface parallel with the FPC-holding surface, and the Z axis defines the height from the FPC-holding surface.

In the present example, squeegees (described later) are caused to move in the X direction which is along the X axis. In view of this, the X direction is also referred to as a "squeegee moving direction". In the drawings, the directions opposite to the X direction, the Y direction along the Y axis, and the Z direction along the Z axis, which are indicated by the arrows, are respectively referred to as a "–X direction", a "–Y direction", and a "–Z direction" for distinction. In the case where the distinction is not necessary, an "X-axis direction" will be used to refer to both "X direction" and "–X direction". Similarly, a "Y-axis direction will be used to refer to both "Y direction" and "–Y direction", and a "Z-axis direction" to both "Z direction" and "–Z direction".

As shown in FIGS. 1 and 2, the pallet 1a is broadly composed of a substantially plate-like base plate 11 having a base surface 111 which extends in an XY plane defined by the X and Y axes; and an adhesive layer 12a formed by applying an adhesive material to the base surface 111. The base plate 11 is preferably made of thermal conductive, synthetic materials. In the present embodiment, the base plate 11 is formed of a metal such as aluminum or magnesium. As the adhesive material, in the case where heat resistance is required, a silicon rubber is preferably used, and in the case where heat resistance is not required, a polyurethane rubber or the like may also be used.

As explicitly shown in FIG. 1, the adhesive layer 12a includes a holding section 13a having three holding regions 131a; and a guide section 14a having two guide regions 141a. The holding regions 131a each are formed of an adhesive material having predetermined tackiness per unit area and in a rectangular plate shape so as to have substantially the same size. The three holding regions 131a are arranged collinearly on the base surface 111 along the X-axis direction (the squeegee moving direction in a screen-printing apparatus) so as to be spaced apart from each other. That is, both ends of the three holding regions 131a which are directed perpendicular to the Y-axis direction are lying on substantially the same line.

The two guide regions 141a each are formed of an adhesive material having predetermined tackiness per unit area and in a belt shape extending in the X-axis direction so as to have substantially the same size. The guide regions 141a are provided on the base surface 111 so as to come into contact with both ends of the holding regions 131a arranged linearly in a spaced-apart manner. Note that two spaces each surrounded by the guide regions 141a and the holding regions 131a are referred to as "spaces S".

The top surfaces of the three holding regions 131a configured and arranged in the above-described manner together compose a holding section 13a, and the top surfaces of the two guide regions 141a configured and arranged in the above-described manner together compose a guide section 14a.

As shown in FIG. 2, the holding section 13a and the guide section 14a are formed to have the same height from the base surface 111. The length of the adhesive layer 12a in the Y-axis direction which is perpendicular to the squeegee direction (the X-axis direction) is set to be shorter than the edge length of a squeegee to be used.

The guide regions 141a are formed to have higher surface roughness than the holding regions 131a so that the tackiness of the guide regions 141a is lower than that of the holding regions 131a. Note that the tackiness indicates a value which is equivalent to a load required to peel a certain area of an object having been adhered to something under predetermined conditions, and which indicates a tackiness level. In the present invention, the tackiness of the guide regions 141a is set to values, as will be described later, at which the guide regions 141a can withstand squeegee movement in the X direction during a squeegee operation, and at which a screen mask can be easily removed from the guide regions 141a when the force to lift the screen mask in the Y direction is applied.

Note that in FIG. 1 the holding region 131a and the guide region 141a are indicated by different hatching patterns; these hatching patterns are intended to indicate that the holding region 131a and the guide region 141a have different tackiness, but not to indicate cross sections. The tackiness of the holding region 131a and the guide region 141a can be regulated by forming asperity patterns having different characteristics, on the holding region 131a and the guide region 141a. Instead of changing surface roughness between the holding region 131a and the guide region 141a, the holding region 131a and the guide region 141a may be formed using adhesive materials having different tackiness per unit area.

The adhesive layer 12a is configured such that substantially the entire underside of an FPC is held onto the top surface of a holding region 131a and a portion of the FPC which should not be adhered to the top surface of the holding region 131a is located in a space S. In the present embodiment, three FPCs in total are held to the holding section 13a.

An electronic component mounting system includes a loader, a screen-printing apparatus (see FIG. 3), an installation apparatus (not shown), a ref low apparatus (not shown), an unloader (not shown), and a cleaning apparatus (not shown) disposed in this order from the upstream side viewed from a flow of an FPC 9; in addition, a conveyor (see FIG. 3) is disposed in substantially the center of these apparatuses to carry a pallet from upstream to downstream. The loader places an FPC on a pallet. The screen-printing apparatus prints solder paste on the FPC being placed on the pallet. The installation apparatus installs electronic components on the solder paste printed on the FPC. The reflow apparatus causes the solder paste to melt and solidify to fix and mount the electronic components on the FPC. The unloader removes the FPC having mounted thereon the electronic components from the pallet. The cleaning apparatus cleans an adhesive layer of the pallet from which the FPC has been removed.

Figure 3:
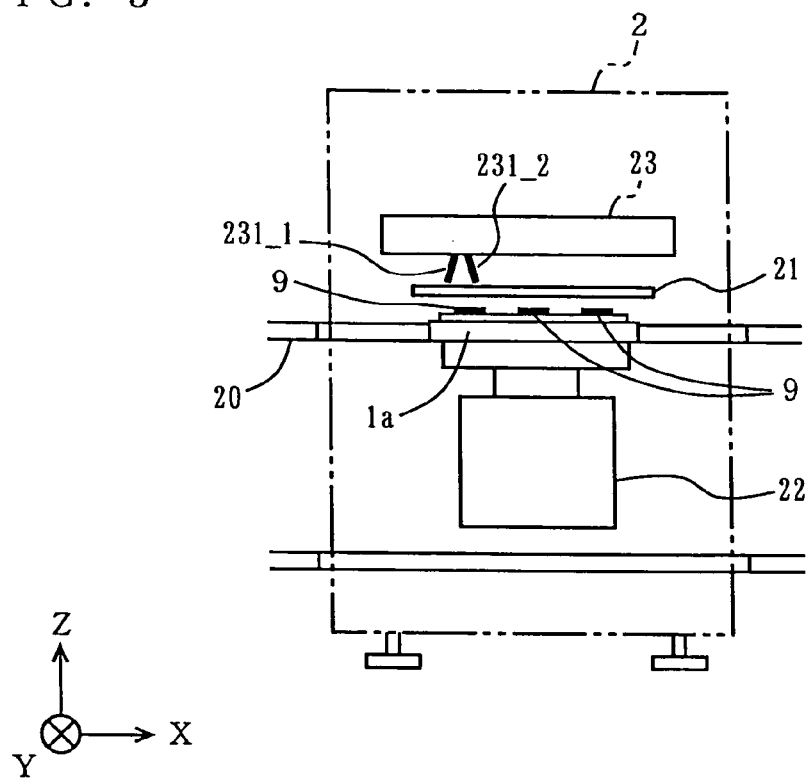
FIG. 3 is a front view of a screen-printing apparatus for printing solder paste onto FPCs being held onto the pallet shown in FIG. 1.

FIG. 3 is a front view of a screen-printing apparatus for screen-printing solder paste onto an FPC. A screen-printing apparatus 2 includes a screen mask 21 having openings provided therein to correspond to printing patterns; an elevation mechanism 22 for positioning and holding a pallet 1a and moving the pallet 1a in the Z-axis direction; and a printing mechanism 23 for moving two squeegees 231-1 and 231-2 back and forth in the X-axis direction in a coordinated manner. In the drawing, the squeegee 231-1 is located on the −X direction side and the squeegee 231-2 is located on the X direction side.

The pallet 1a holding three FPCs 9 is carried by a conveyor 20 in the screen-printing apparatus 2 from a loader disposed on the upstream side with respect to a carrying direction (the X direction) of the FPCs (i.e., on the left side of the screen-printing apparatus 2 in FIG. 3). Then, the elevation mechanism 22 elevates the pallet 1a having the FPCs being held thereto in the Z direction, so that the three FPCs 9 are abutted against the screen mask 21. Subsequently, the squeegees 231-1 and 231-2 are allowed to move in the X direction to print solder paste onto each of the FPCs 9 being held onto the pallet 1a through the openings provided in the screen mask 21.

Here, movement of the squeegees 231-1 and 231-2, which are used to print solder paste onto the FPCs 9, in the X direction is referred to as a "squeegee operation", and the X direction is referred to as a "squeegee direction". In addition, a surface of the squeegee 231-1 (on the right side in FIG. 3) which pushes solder paste against the screen mask 21 during the squeegee operation is referred to as a squeegee surface, and a surface on the other side of the squeegee surface is referred to as a "non-squeegee surface".

Figure 4:
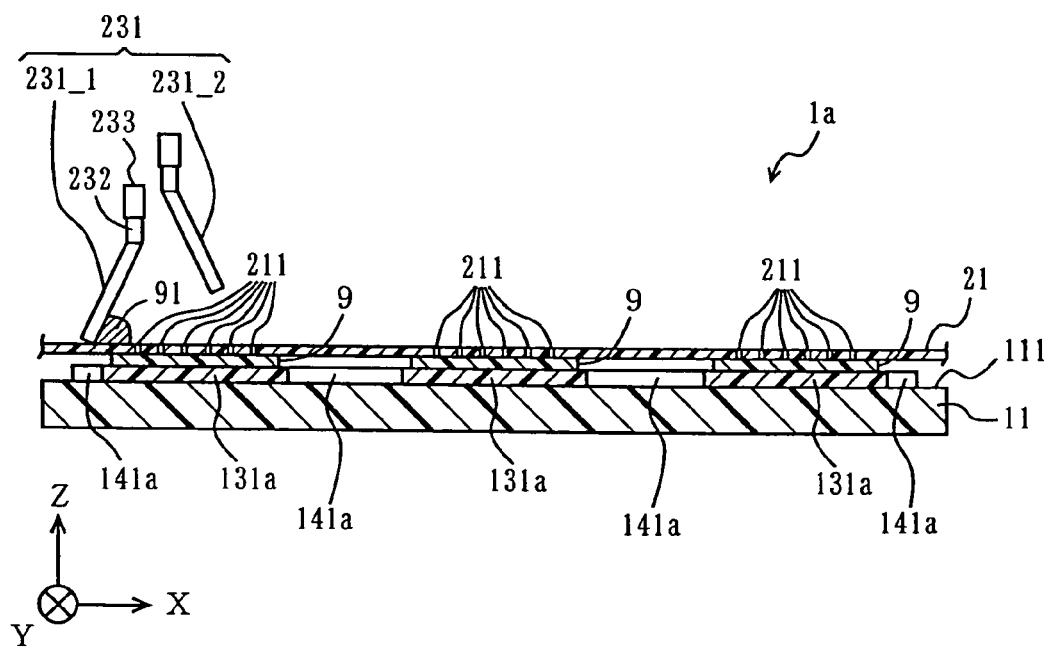
FIG. 4 is a diagram illustrating a state of the pallet, the FPCs, a screen mask, squeegees, and solder paste in the screen-printing apparatus shown in FIG. 3, immediately before screen-printing is performed.
Figure 5:
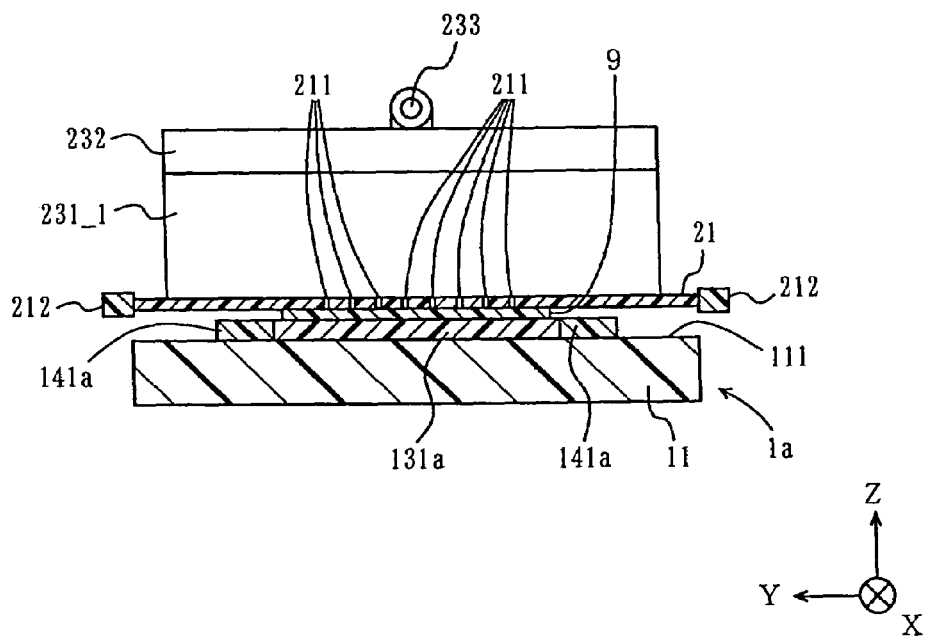
FIG. 5 is a drawing illustrating the state shown in FIG. 4 as viewed from the non-squeegee surface side.
Figure 6:
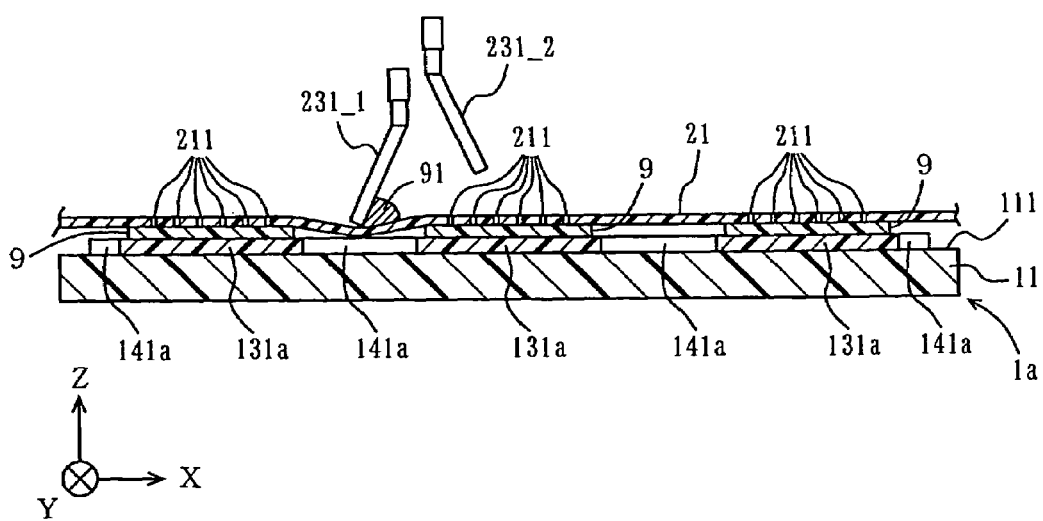
FIG. 6 is a diagram illustrating a state of the pallet, the FPCs, the screen mask, the squeegees, and the solder paste in the screen-printing apparatus shown in FIG. 3, during screen-printing.
Figure 7:
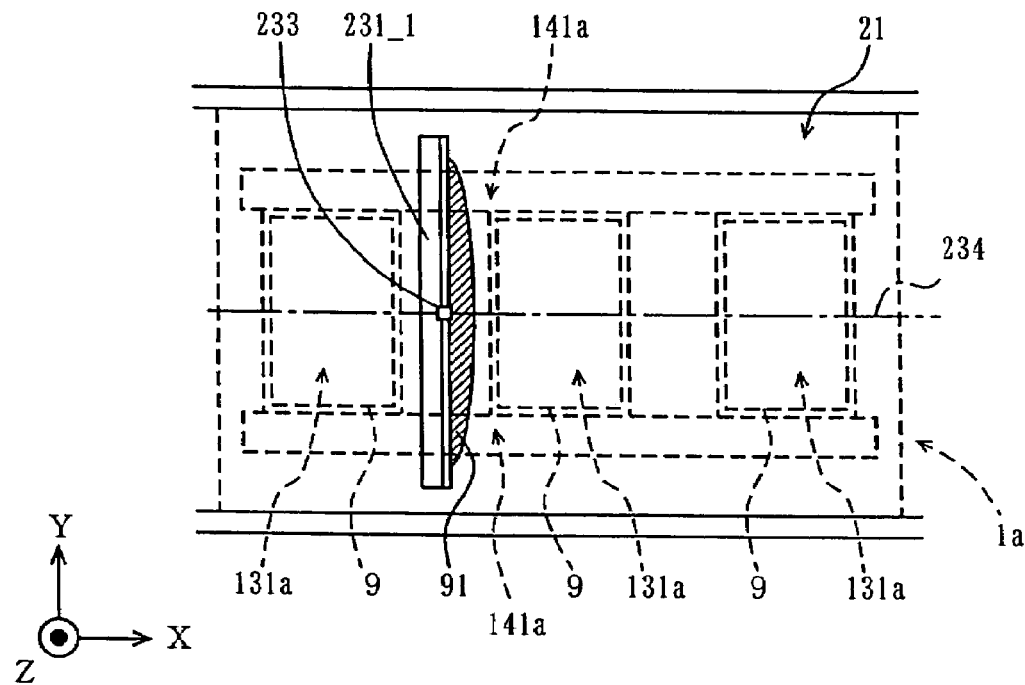
FIG. 7 is a drawing illustrating the state shown in FIG. 6 as viewed from the topside of the squeegee.
Figure 8:
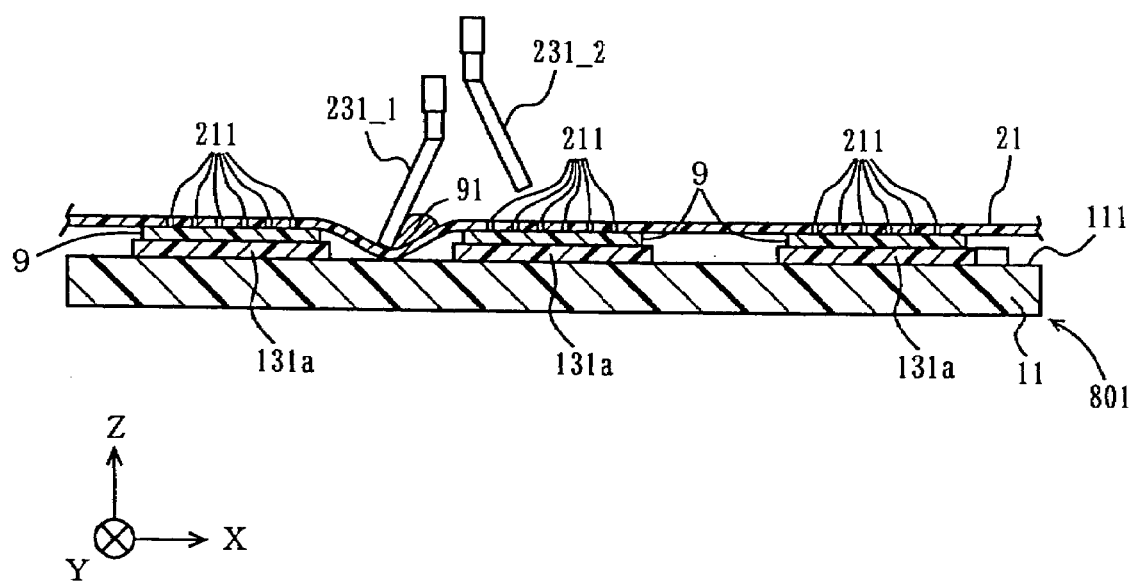
FIG. 8 is a drawing illustrating a state of a pallet, FPCs, a screen mask, squeegees, and solder paste during screen-printing, in the case where guide regions are removed from the pallet shown in FIG. 1.

Referring to FIGS. 4 to 8, there is described screen-printing according to the present invention. FIG. 4 shows a state immediately before solder paste printing is performed in the screen-printing apparatus 2 shown in FIG. 3, by means of squeegees 231 through a screen mask 21 being abutted against surfaces of FPCs 9 being held to an adhesive layer 12a of a pallet 1a. FIG. 5 shows the pallet 1a, the adhesive layer 12a, the screen mask 21, and the squeegee 231-1 in the state shown in FIG. 4 as viewed from the upstream side of the squeegee operation (i.e., the non-squeegee surface side of the squeegee 231-1). FIG. 6 shows a state in which the pallet 1a, the adhesive layer 12a, the screen mask 21, the squeegees 231-1 and 231-2 shown in FIG. 4 are being screen-printed. FIG. 7 shows the squeegee operation shown in FIG. 6 as viewed from the topside of the squeegee 231-1. Note that in FIG. 7 the squeegee 231-2 is omitted for better visibility. FIG. 8 shows a screen-printing operation in the case where a guide section 14a is not provided to the adhesive layer 12a, as viewed from the front of the screen-printing apparatus 2.

As shown in FIG. 4, immediately before screen-printing, the squeegee 231-1 is positioned in contact with solder paste 91 on the squeegee direction (the X direction) side. The solder paste 91 is being applied to the screen mask 21 in a location outside of the outermost periphery of openings 211 of the screen mask 21, with respect to the squeegee direction (the X direction). A frame 232 is provided to the top of the squeegee 231-1. The squeegee 231-1 is connected to the elevation mechanism 33 through a pivot shaft 233 being connected to the frame 232.

As shown in FIG. 5, the screen mask 21 is being held by a frame 212 provided at the perimeter thereof. The squeegee 231-1 is mounted to the printing mechanism 23 (see FIG. 3) via the frame 232 and is supported so as to pivot around the pivot shaft 233. The pivot shaft 233 is provided at the center of the width side of the squeegee 231-1 and is pivotable in the X axis. The printing mechanism 23 (not shown) allows the squeegees 231-1 and 231-2 to move up and down individually in the Z-axis direction. When the squeegee 231-1 is moved down to press the screen mask 21, the pivot shaft 233 acts as the point at which the force of pressing the squeegee 231-1 in the −Z direction is created.

In the screen-printing apparatus 2, when printing the solder paste 91 onto the FPCs, first, of the squeegees 231-1 and 231-2 being held above the screen mask 21, the squeegee 231-1 is allowed to move down to press the screen mask 21. At this point, the squeegee 231-2 is still being held above the screen mask 21. Then, the printing mechanism 23 allows the squeegees 231-1 and 231-2 to move in the X direction (the squeegee direction) in a coordinated manner. Here, the squeegee 231-1 moves while pressing the screen mask 21, thereby pushing out and squeegeeing the solder paste 91 being applied onto the screen mask 21 in the X direction and the −Z direction. The solder paste 91 pushed out in the −Z direction is filled in the openings 211 of the screen mask 21.

Referring now to FIGS. 6 and 7, there is described in detail the state of the squeegee 231-1 during the aforementioned squeegee operation, particularly, the state of the squeegee 231-1 when being located above a space S. When the squeegee 231-1 is located above a holding region 131a, the screen mask 21 is supported by the holding region 131a being abutted against the screen mask 21 through an FPC 9. Specifically, a portion of an edge of the squeegee 231-1 which is used to fill the solder paste 91 in the openings 211 of the screen mask 21 is entirely supported by the holding region 131a. Hence, the squeegee 231-1 does not sink in the −Z direction due to a squeegee force, and thus can move the solder paste 91 properly in the X and −Z directions.

As shown in FIG. 6, in a space S, there is no holding region 131a which supports the squeegee 231-1 against a squeegee force. However, as shown in FIG. 7, the squeegee 231-1 is supported by two guide regions 141a provided in an embedded manner on both sides of holding regions 131a. Here, a side portion of the edge of the squeegee 231-1 which is not used to fill the solder paste 91 in the openings 211 of the screen mask 21 is partially supported by the guide regions 141a. That is, since the squeegee 231-1 is supported by the guide regions 141a at its side portion, if the squeegee 231-1 has sufficient stiffness, the edge of the squeegee 231-1 will not be deformed, and thus it is not likely that the squeegee 231-1 would sink on the side of the base plate 11 from a surface of an adhesive layer 12a.

The solder paste 91 being applied to a space S, on the hand, has nothing but only the screen mask 21 to with stand a squeegee force of the squeegee 231-1. Therefore, the solder paste 91 may slightly sink on the side of base plate 11 in accordance with elastic deformation of the screen mask 21 (see FIG. 6); however, this sinking would not be problematic if the solder paste 91 has sufficient fluidity. In addition, because an FPC 9 is not provided to the guide regions 141a, when the squeegee 231-1 moves from the top of a holding region 131a to a space S, the solder paste 91 sinks in the direction of the base plate 11 to a depth equal to the thickness of an FPC 9, causing deformation of the screen mask 21, but the deformation would not be problematic. If it is problematic, the guide regions 141a may be formed such that the height is greater than that of the holding regions 131a by a value equal to the thickness of the FPC 9.

Note that in FIG. 7 the solder paste 91 present on the squeegee surface side of the squeegee 231-1 is hatched and shown larger than actual size for better visibility. In addition, in FIG. 7, a dash-dotted line 234 indicates the path (hereinafter referred to as a "shaft path") along which the pivot shaft 233 provided at the center of the width side (the Y-axis direction side) of the squeegee 231-1 and the squeegee 231-1 move.

More specifically, in the screen-printing apparatus 2, when FPCs 9 are being held onto a pallet 1a, in spaces S the edge of the squeegee 231-1 on the squeegee surface side which moves in the X direction can be continuously abutted against and supported by guide regions 141a through a screen mask 21. In addition, above the spaces S, the squeegee 231-1 is being abutted against the guide regions 141a through the screen mask 21 while moving from near the printing start position to near the printing end position.

After the solder paste 91 has been filled in the openings 211 by the squeegee operation (i.e., movement in the X direction) of the squeegee 231-1, the elevation mechanism 22 allows the pallet 1a with the FPCs 9 to move down to remove the screen mask 21. The solder paste 91 filled in the openings 211 is removed from the openings 211 and attached onto the FPCs 9 (i.e., the solder paste 91 is transferred to the FPCs 9), thereby completing printing of the solder paste 91 onto the three FPCs 9 being held onto the pallet 1a. After completion of printing, the FPCs 9 and the pallet 1a are carried by a conveyor 20 in an installation apparatus located on the downstream side in the X direction.

FPCs 9 to be printed next are held onto another pallet 1a and carried in the screen-printing apparatus 2 by the conveyor 20. Then, in the same manner as described above, the FPCs 9 are held to be abutted against a screen mask 21. Here, while the squeegee 231-1 used in the last operation is allowed to move up, the squeegee 231-2 not used in the last operation is allowed to move down so that the screen mask 21 is abutted against the FPCs 9. That is, printing of solder paste 91 onto the FPCs is performed in the same manner as that described above, i.e., by repeating the squeegee operation described with reference to FIGS. 4, 5, 6, and 7, except that the squeegee 231-2 is used instead of the squeegee 231-1. As described above, in the screen-printing apparatus 2, solder paste printing is performed continuously on FPCs 9 being held onto a pallet 1a which is carried continuously, by switching two squeegees 231-1 and 231-2 to move back and forth in the X-axis direction. The squeegees 231-1 and 231-2 basically have the same function and thus are collectively referred to as a "squeegee 231' in the case where the distinction between the two is not necessary.

Referring to FIG. 8, there is described the possible influence of the presence/absence of guide regions 141a according to the present invention on the printing operation, by comparing with FIG. 6. FIG. 8 shows, as with FIG. 6, a state of a squeegee operation as viewed from the front of the screen-printing apparatus 2. A pallet 801 to be used here is constructed by removing a guide section 14a from a pallet 1a.

In the case of the pallet 801 too, when a squeegee 231 is located above a holding region 131a, a screen mask 21 is being supported by the holding region 131a being abutted against the screen mask 21 through an FPC 9. Specifically, only a portion of an edge of the squeegee 231 which is used to fill solder paste 91 in openings 211 of the screen mask 21 is entirely supported by the holding region 131a. Hence, the squeegee 231 does not sink in the −Z direction due to a squeegee force, and thus can move the solder paste 91 properly in the X and −Z directions.

On the other hand, in a space S between holding regions 131a, as is the case with a pallet 1a, there is no holding region 131a which supports the squeegee 231 against a squeegee force. In addition, unlike the case with the pallet 1a, two guide regions 141a are not provided on both sides of the holding regions 131a. That is, in the space S, the squeegee is supported only by the screen mask 21. Therefore, the squeegee 231 significantly sinks to a depth where it contacts with a base surface 111 of a base plate 11 through the screen mask 21, causing significant deformation of the screen mask 21. In this manner, the openings 211 are deformed during or after filling of the solder paste 91, and accordingly the solder paste 91 is printed on the FPCs 9 in improper patterns (quality).

By contrast, as shown in FIG. 6, in the case where a pallet 1a having provided thereon guide regions 141a (i.e., guide section 14a) is used in the screen-printing apparatus 2, even in a space S where there is no holding region 131a, the squeegee 231 can be continuously supported by the guide regions 141a through a screen mask 21. Thus, deformation (deflection) of the screen mask 21 due to the pressing force of the squeegee 231 is reduced, thereby stabilizing the movement operation (i.e., the printing operation) of the squeegee 231 in the X direction. In addition, since the guide regions 141a are arranged on both sides of the holding region 131a and the shaft path 234, the squeegee 231 can be supported stably, which further stabilizes the printing operation. Moreover, since the squeegee 231 can be supported by the guide regions 141a even at positions near the printing start-end positions of the pallet 1a, a stable printing operation is achieved at the time of starting and ending of printing onto the FPC 9. Accordingly, by using the pallet 1a when performing solder paste printing in the screen-printing apparatus 2, the quality of printing onto FPCs 9 can be improved.

Further, the tackiness of the guide regions 141a is set to a level at which the screen mask 21 can be easily peeled off the guide regions 141a; therefore, after printing, when the screen mask 21 is removed from the pallet 1a, deformation of the openings 211 or degradation of the screen mask 21 will not occur.

In the pallet 1a, by forming a holding section 13a and a guide section 14a integrally as an adhesive layer 12a, the formation of holding regions 131a and guide regions 141a can be simplified.

As described above, the pallet 1a holds the entire FPCs by adhesion with the holding regions 131a of the adhesive layer 12, and thus it is possible to prevent the FPCs 9 from peeling off the pallet 1a when mounting electronic components. Here, by providing spaces S in the adhesive layer 12a, an undesired adhesion between the screen mask 21 and the adhesive layer 12a can be prevented. In addition, the guide regions 141a are provided to prevent sinking of the squeegee 231 in the spaces S. The guide regions 141a are configured to have tackiness at which during screen-printing the screen mask 21 can be sufficiently held to sustain the squeegee operation, and at which after printing of the solder paste 91 deformation of the screen mask 21 does not occur. In this manner, the present embodiment solves problems associated with undesired adhesion that may damage the screen mask 21 and with sinking of the squeegee 231 during the squeegee operation.

<First Alternative>

Figure 9:
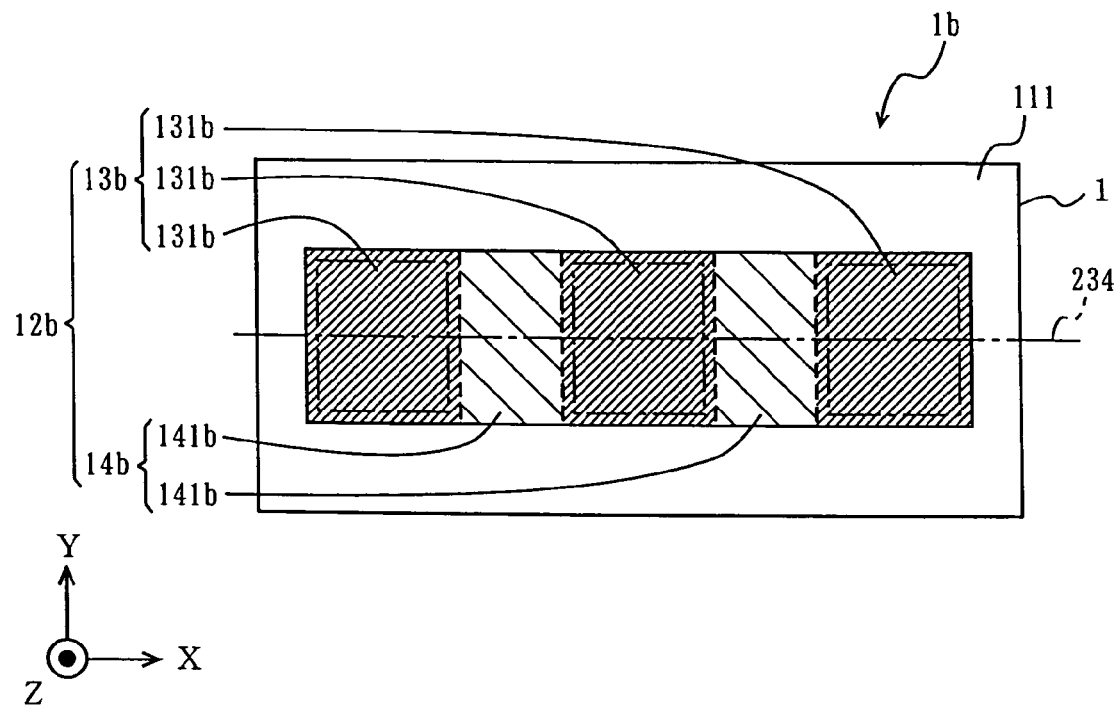
FIG. 9 is a plan view of a pallet according to a first alternative of the first embodiment of the present invention.

Referring to FIG. 9, there is described a pallet 1b which is a first alternative of the substrate holder for carrying FPCs, according to the first embodiment of the present invention. As with FIG. 1, FIG. 9 is a top view of an FPC-holding surface of the pallet 1b. The pallet 1b has an adhesive layer 12b formed on a base surface 111 of a base plate 11, as with a pallet 1a. The adhesive layer 12b includes a holding section 13b and a guide section 14b.

Specifically, as with holding section 13a of a pallet 1a, the holding section 13b has three holding regions 131b arranged collinearly so as to be spaced apart from each other. In FIG. 9, as shown by a dash-double dotted line, the holding regions 131b each is formed slightly larger than an FPC 9 being held thereto. In addition, while a guide section 14a has two belt-shaped guide regions 141a arranged on both sides of holding regions 131a, the guide section 14b has two guide regions 141b formed in rectangular spaces which are provided between the holding regions 131b. As with the guide regions 141a, the tackiness of the guide regions 141b is set to a level lower than that of the holding regions 131a. In FIG. 9 too, as with FIG. 1, the holding region 131b and the guide region 141b are indicated by different hatching patterns to show they have different tackiness.

The two guide regions 141b shown in FIG. 9 are provided in the spaces S between the holding regions 131b arranged linearly along the X-axis direction, so as to continue with the holding regions 131b, and the width of each of the guide regions 141b in the Y-axis direction is the same as that of each of the holding regions 131b. The center of the width side of each of the holding region 131b and the guide region 141b is arranged so as to lie on a shaft path 234 in an XY plane. The height of each of the guide regions 141b from the base surface 111 is the same as that of each of the holding regions 131b.

In the aforementioned screen-printing apparatus 2, by holding FPCs 9 using the pallet 1b, even in a space between two holding regions 131b, a squeegee 231 can be continuously abutted against a guide region 141b through a screen mask 21. That is, the entire length of the squeegee 231 can be supported by the guide region 141b. Therefore, deformation (deflection) of the screen mask 21 due to the pressing force of the squeegee 231 is reduced, thereby stabilizing the printing operation of the squeegee 231. In addition, since the guide regions 141b are arranged over both sides (the Y-axis direction) of the shaft path 234, the squeegee 231 can be stably supported.

Because an FPC 9 is not placed in a guide region 141b, when the squeegee 231 moves to the guide region 141b from a holding region 131b, the squeegee 231 may sink to a depth equal to the thickness of the FPC 9; however, the sinking would not be problematic. If the sinking depth is problematic, the guide section 14b may be formed such that the height from the base plate 11 is greater than that of the holding section 13b by a value equal to the thickness of the FPC 9.

Further, since the holding regions 131b (and FPCs 9 being held to the holding regions 131b) and the guide regions 141b, which support the squeegee 231 through the screen mask 21, have substantially the same width in the movement direction (the X-axis direction) of the squeegee 231, the contact state (i.e., the width where a strong contact is provided) between the squeegee 231 and the screen mask 21 is kept constant, and thus printing can be performed stably. In addition, since the tackiness of the guide regions 141b is lower than that of the holding regions 131b, in the spaces, adhesion of the screen mask 21 to the guide regions 141b during printing can be suppressed.

In the pallet 1b, a plurality of holding regions 131b and a plurality of guide regions 141b are arranged linearly, and thus the holding regions 131b and the guide regions 141b can be formed easily. In addition, by forming holding regions 131b and guide regions 141b (i.e., the top surface of an adhesive layer 12b) to have a simple rectangular shape, the adhesive layer 12b can be formed more easily than an adhesive layer 12a.

<Second Alternative>

Figure 10:
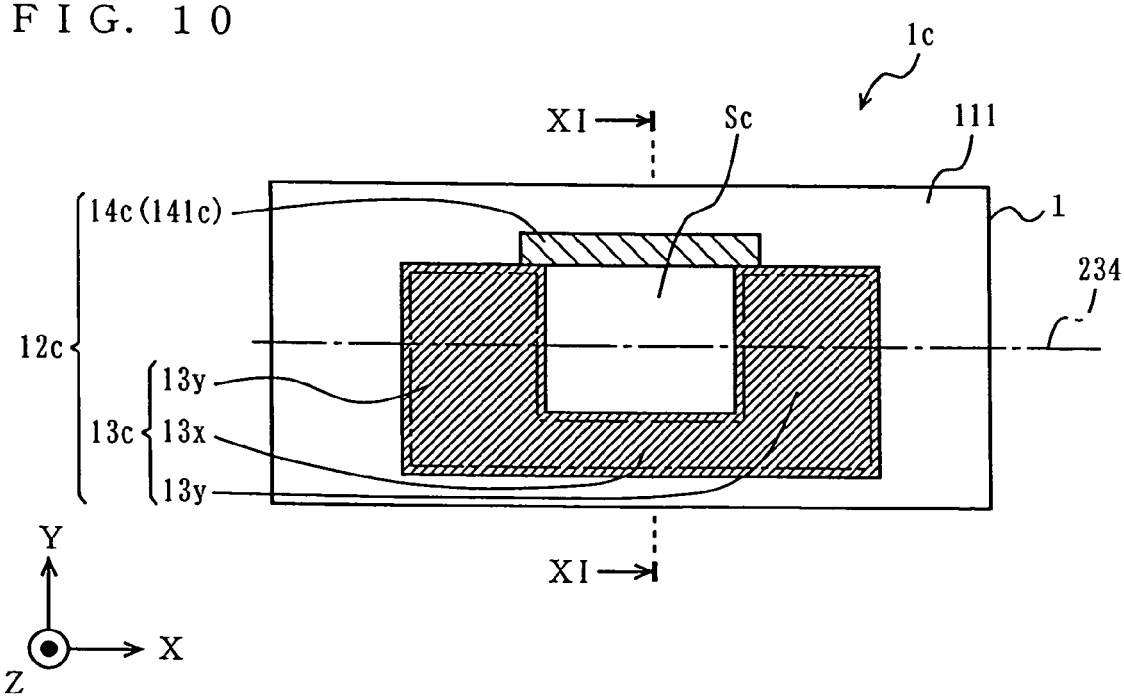
FIG. 10 is a plan view of a pallet according to a second alternative of the first embodiment of the present invention.
Figure 11:
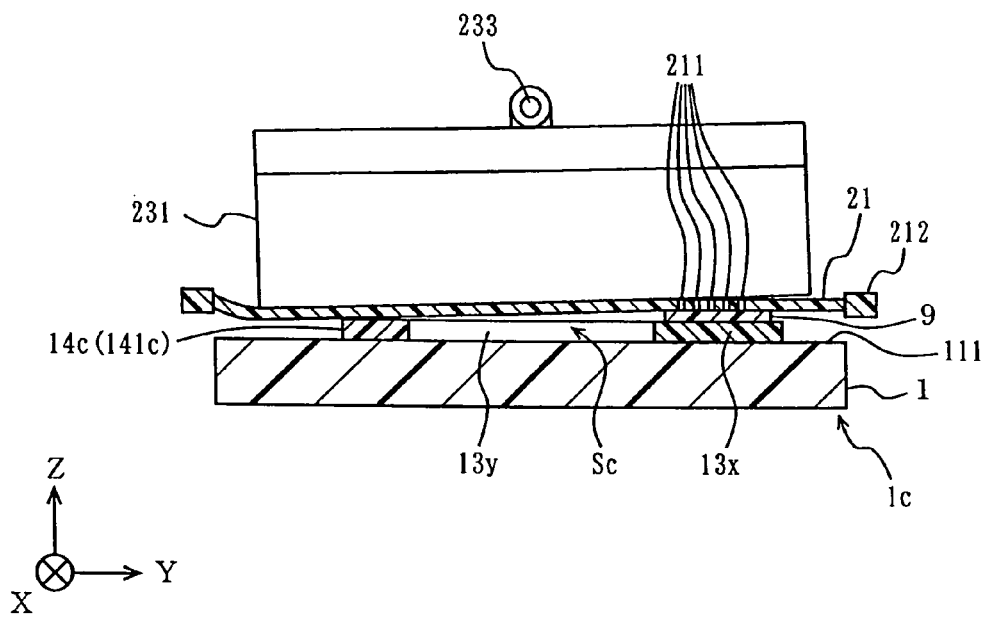
FIG. 11 is a drawing illustrating a state of screen-printing in the case of the pallet shown in FIG. 10, as viewed from the non-squeegee surface side.
Figure 12:
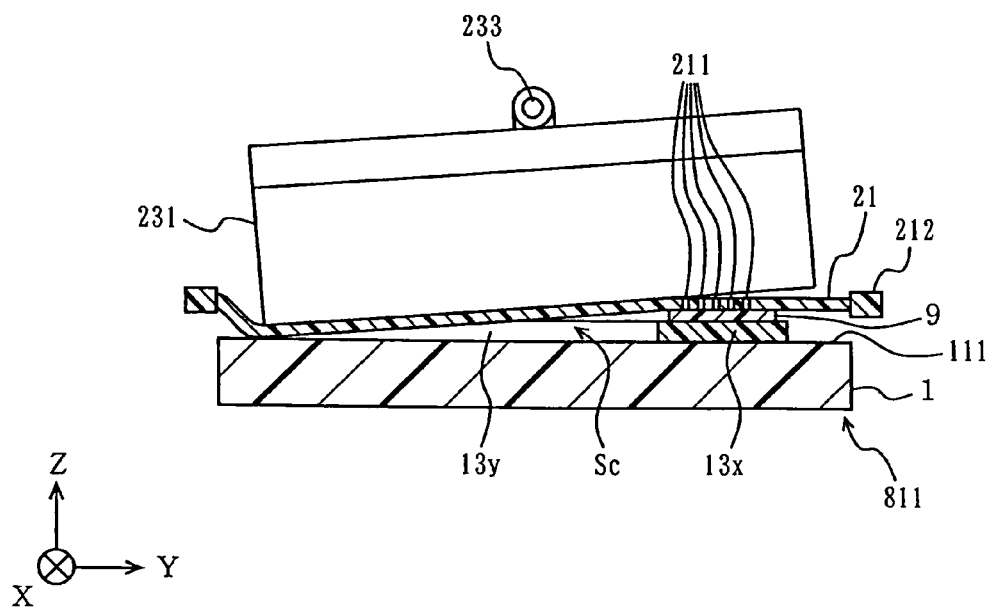
FIG. 12 is a drawing illustrating a state of screen-printing in the case where a guide region is removed from the pallet shown in FIG. 10, as viewed from the non-squeegee surface side.

Referring to FIGS. 10, 11, and 12, there is described a pallet 1c which is a second alternative of the substrate holder for carrying FPCs, according to the first embodiment of the present invention. As with FIGS. 1 and 9, FIG. 10 is a top view of an FPC-holding surface of the pallet 1c. The pallet 1c has an adhesive layer 12c formed on a base surface 111 of a base plate 11, as with pallets 1a and 1b. The adhesive layer 12c includes a holding section 13c and a guide section 14c.

Unlike the aforementioned holding sections 13a and 13b, the holding section 13c is formed in a substantially C-shape. Specifically, two rectangular side portions 13y extending in the Y-axis direction are integrated with a rectangular central portion 13x extending in the X-axis direction such that ends of the side portions 13y and the central portion 13x in the X-axis direction are aligned on substantially the same line. By the side portions 13y and the central portion 13x, a holding section 13c is formed which has a substantially C-shape rotated counterclockwise by 45 degrees and which has an opening on the side of the other end of the central portion 13x in the X-axis direction (on the upper side in FIG. 10). A rectangular guide region 141c extending in the X-axis direction is provided in contact with the other ends of the side portions 13y in the X-axis direction, so as to block the opening. By thus arranging the guide region 141c and the holding section 13c, a space Sc is provided in the adhesive layer 12c. The top surface of the guide section 14c composes the guide region 141c, and the top surfaces of the central portion 13x and the side portions 13y together compose the holding section 13c.

As shown by a dash-double dotted line, as with a holding region 131b, the holding section 13c is formed slightly larger than an FPC 9 being held thereto. That is, the pallet 1c according to the present alternative can be used for such an FPC 9 that at least its holding portion is formed in the same shape as the holding section 13c, i.e., a rotated substantially C-shape. For convenience of the following description, portions of an FPC 9 corresponding to the side portion 13y and the central portion 13x are referred to as an "FPC side portion 9y" and an "FPC central portion 9x", respectively, for distinction.

As shown in FIG. 10, the central portion 13x has a smaller width in the Y-axis direction than the side portion 13y, and is provided only on the −Y direction side from a shaft path 234. The guide region 141c is provided on the opposite side (on the Y direction side) of the shaft path 234 from the central portion 13x, so as to block a region (space Sc) surrounded by the central portion 13x and the two side portions 13y. The guide region 141c and the holding section 13c are formed to have the same height from the base surface 111.

As with FIG. 5, FIG. 11 shows a pallet 1c, an adhesive layer 12c, a screen mask 21, and a squeegee 231, as viewed from the upstream to downstream directions (i.e., the X direction) of a squeegee operation. The following describes printing of solder paste 91 onto an FPC 9 in a substantially rotated C-shape which is being held to a holding section 13c in a manner described above.

In the case where a normal pallet is used, when printing the solder paste 91 onto an FPC side portion 9y, the squeegee 231 is supported uniformly and symmetrically with respect to a shaft path 234, by the length side of the side portion 13y through the screen mask 21 and the FPC side portions 9y. On the other hand, when printing the solder paste 91 onto an FPC central portion 9x, only a portion of the squeegee 231 which is greatly displaced in the −Y direction from the shaft path 234 can be supported by the central portion 13x through the screen mask 21 and the FPC central portion 9x, and a portion of the squeegee 231 in the Y direction from the shaft path 234 cannot be supported. Accordingly, in a space Sc, the squeegee 231 sinks significantly on the side of the base plate 11, thereby deforming the screen mask 21.

However, since the pallet 1c has a guide section 14c formed integrally with the side portions 13y on the opposite side of the shaft path 234 from the central portion 13x, even when the squeegee 231 is located above the central portion 13x, the squeegee can be supported on both sides (Y direction and −Y direction) of the shaft path 234. Therefore, in the space Sc, the squeegee 231 cannot sink on the side of the base plate 11, and the same advantageous effects as those obtained by a guide section 14a of the aforementioned pallet 1a can be obtained. Note, however, that unlike the guide section 14a of the pallet 1a, an FPC 9 is not placed on the guide section 14c, and thus the height of the screen mask 21 from the base plate 11 is lower on the side of the guide section 14c by a value equal to the thickness of the FPC 9. Hence, the squeegee 231 may sink to a depth equal to the height difference between the side of the guide section 14c and the side of the central portion 13x, causing deformation of the screen mask 21; however, the deformation level is negligible. If the height difference is not negligible, an adhesive layer 12c may be formed such that the height of the guide section 14c is higher than the holding section 13c by a value equal to the thickness of the FPC 9.

Referring to FIG. 12, there is described the possible influence of the presence/absence of a guide section 14c of a pallet 1c on a squeegee operation. In FIG. 12, a pallet 801 is constructed by removing a guide section 14c from an adhesive layer 12c of a pallet 1c. As with FIG. 11, FIG. 12 shows a pallet 811, an FPC 9, a screen mask 21, and a squeegee 231, as viewed from the upstream to downstream directions (i.e., the X direction) of a squeegee operation. In the pallet 811 in which the guide section 14c is removed from the pallet 1c, the squeegee 231 being abutted against the pallet 811 through the screen mask 21 and the FPC 9 (an FPC central portion 9x) being held above a central portion 13x which is present only on the −Y direction side from a pivot shaft 233, pivots around the pivot shaft 233 counter-clockwise in FIG. 12. The screen mask 21 on the Y direction side is pressed by the squeegee 231, and thus is deformed significantly to a level where it contacts with a base surface 111 of a base plate 11.

On the other hand, as shown in FIG. 11, in the case where a pallet 1c having provided thereon a guide region 141c (a guide section 14c) is used in the screen-printing apparatus 2, the squeegee 231 is supported by the guide region 141c from the Y direction side of a pivot shaft 233. Thus, the tilt of the squeegee 231 in a YZ plane is reduced, thereby stabilizing the printing operation of the squeegee 231. Accordingly, the quality of printing onto an FPC 9 in the screen-printing apparatus 2 can be improved.

Since the tackiness of the guide region 141c is lower than that of the holding section 13c, adhesion of the screen mask 21 to the guide region 141c is suppressed. Further, since the holding section 13c and the guide section 14c are formed integrally as shown in FIG. 10, the holding region 131c and the guide region 141c can be formed easily. Note that the holding section 13c and the guide section 14c are not necessarily formed integrally; the holding section 13c and the guide section 14c may be formed to be spaced apart from each other as long as the space does not adversely affect a squeegee operation.

<Third Alternative>

Figure 13:
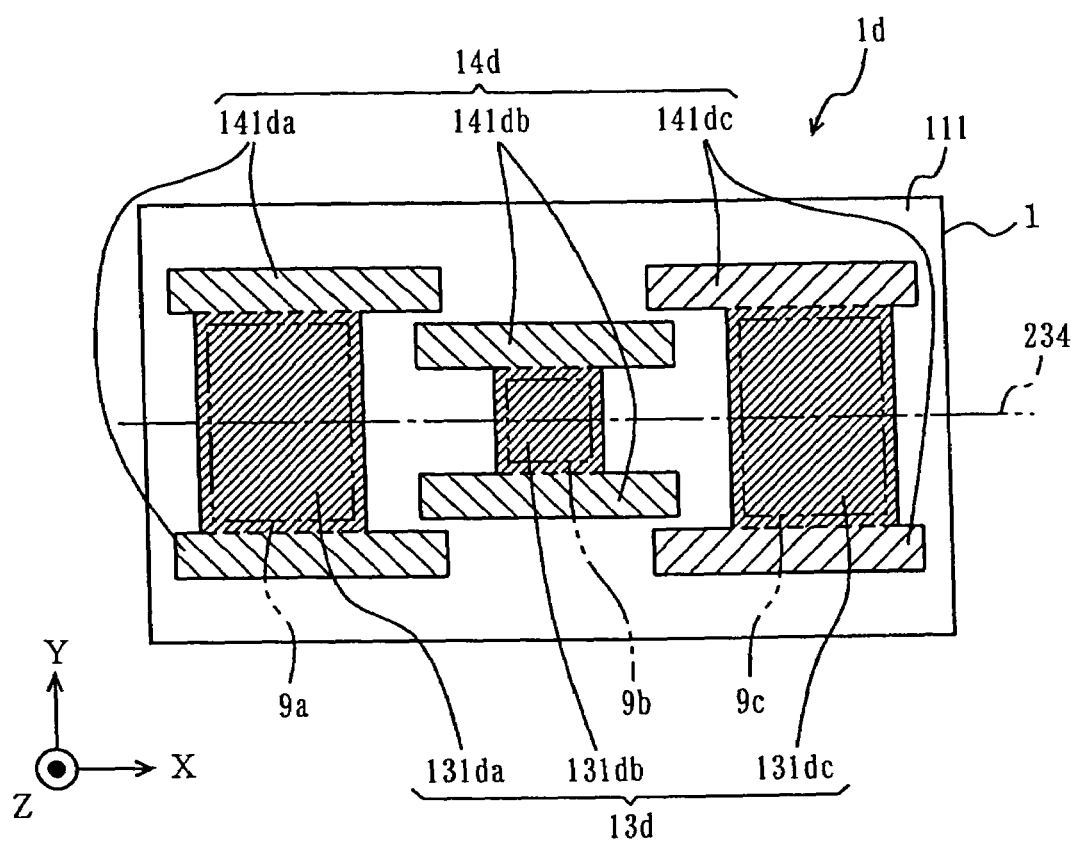
FIG. 13 is a plan view of a pallet according to a third alternative of the first embodiment of the present invention.

Referring to FIG. 13, there is described a pallet 1d which is a third alternative of the substrate holder for carrying FPCs, according to the first embodiment of the present invention. As with FIG. 1, FIG. 13 is a top view of an FPC-holding surface of the pallet 1d. The pallet 1d has a holding section 13d which includes a plurality of holding regions 131d for holding a plurality of FPCs 9 with difference sizes (in the present example in FIG. 13, three FPCs, an FPC 9a, an FPC 9b, and an FPC 9c in the order of the X direction) respectively; and a guide section 14d including guide regions 141d, which is formed integrally with the holding section 13d and provided on the Y and −Y direction sides of the holding section 13d. The top surfaces of the holding regions 131d which hold the FPCs 9 by adhesion compose the holding section 13d. The top surfaces of the guide regions 141d, which are parallel with each other, extend in the X-axis direction (the moving direction of a squeegee 231 of the screen-printing apparatus 2), and sandwich the holding section 13d, together compose the guide section 14d.

In the present example, for convenience of description, the holding regions 131d provided to hold the FPCs 9a, 9b, and 9c, respectively are referred to as a "holding region 131da", a "holding region 131db", and a "holding region 131dc", respectively, for distinction. Similarly, the guide regions 141d formed integrally with the holding regions 131da, 131db, and 131dc, respectively are referred to as a "guide region 141da", a "guide region 141db", and a "guide region 141dc", respectively, for distinction.

In the pallet 1d, the three holding regions 131da, 131db, and 131dc are arranged along the X-axis direction so as to be spaced apart from each other. Three pairs of the guide regions 141da, 141db, and 141dc are formed to be spaced apart from each other; however, they partially overlap with each other so as to be continuous with respect to the X-axis direction.

In the case where the pallet 1d is used in the screen-printing apparatus 2, in spaces between the holding regions 131da, 131db, and 131dc, the squeegee 231 is continuously abutted against at least one pair of the guide regions 141da, 141db, and 141dc through the screen mask 21, and is supported by any of the guide regions 141da, 141db, and 141dc on both Y and −Y direction sides of a shaft path 234. Accordingly, deformation (deflection) of the screen mask 21 due to the pressing force of the squeegee 231 is reduced, thereby stabilizing the printing operation of the squeegee 231. In addition, since the guide regions 141d are arranged on both sides of the shaft path 234, the squeegee 231 can be held stably.

As described above, although a plurality of guide regions 141*da*, 141*db*, and 141*dc* are spaced apart from each other, because the guide regions 141*da*, 141*db*, and 141*dc* are present continuously with respect to the X direction, the printing operation of the squeegee 231 can be stabilized. Note that in FIG. 13 the holding region 131*d* and the guide region 141*d* are indicated by different hatching patterns; these hatching patterns are intended to indicate that the holding region 131*d* and the guide region 141*d* have different tackiness, but not to indicate cross sections.

While the first embodiment of the present invention has been described above, it is to be understood that the invention is not limited thereto, but on the contrary, various modifications and changes may be made thereto. For example, in terms of simplification of formation of a holding region 131 and a guide region 141, it is preferred that a holding section 13*a* and a guide section 14*a* be integrally formed, as shown in a pallet 1*a* of FIG. 1. On the other hand, in the case where a guide region 141 is provided as far as possible from a shaft path 234 so as to stably support a squeegee 231, a holding section 13 and a guide section 14 may be formed to be spaced apart from each other. The same can be said for a pallet 1*c* shown in FIG. 10 and a pallet 1*d* shown in FIG. 13.

In the case where the underside (i.e., the surface to be held) of an FPC 9 to be held to a pallet has a height difference (e.g., the case where a reinforcement plate is provided on the underside), a holding region 131*a* may be formed to have a height difference in accordance with the height difference of the FPC 9. In addition, in order to provide a sufficient thickness to an adhesive layer 12, or to accommodate components provided on the underside of an FPC 9, a base surface 111 of a base plate 11 may be countersunk, if necessary.

In the pallet 1, in terms of simplification of formation of a holding section 13 and a guide section 14, it is preferred that the holding section 13 and the guide section 14 be integrally formed of the same adhesive material. Alternatively, in order to regulate the tackiness of holding regions 131 and guide regions 141, a holding section 13 and a guide section 14 maybe sequentially formed using different materials. In this case, the guide section 14 may be formed using a non-adhesive material.

The adhesive material is not limited to silicon rubber or polyurethane rubber; other materials may be used. An example of other preferable materials includes fluoro rubber. The fluoro rubber has good release properties, and thus in practical use, a surface may be mirror polished, whereby tackiness (closeness of contact) can be improved. Then, for example, by forming fine grooves in the mirror surface, the tackiness of the fluoro rubber surface can be regulated. Note that fluoro rubber does not generate siloxane gas, as experienced when silicon rubber is heated; thus, it is possible to avoid an adverse affect on a circuit board, which may result from deposition of insulating siloxane gas.

Although a pallet 1 is suitable for holding flexible circuit boards such as those formed of polyimide films or very thin glass epoxy resin, the pallet 1 can also hold plate-like circuit boards having high stiffness (e.g., circuit boards formed of glass epoxy or a semiconductor).

Moreover, the pallet 1 for holding flexible circuit boards by an adhesive material may also be used in printing other than screen-printing. For example, the pallet 1 can be used in the case where a liquid material is uniformly applied to FPCs, flexible sheets, or the like, or the case where coating is performed using a liquid material.

SECOND EMBODIMENT

Referring to FIGS. 14 to 28, there is described a pallet 100*a* which serves as a substrate holder for carrying an FPC, according to a second embodiment of the present invention.

Figure 14:
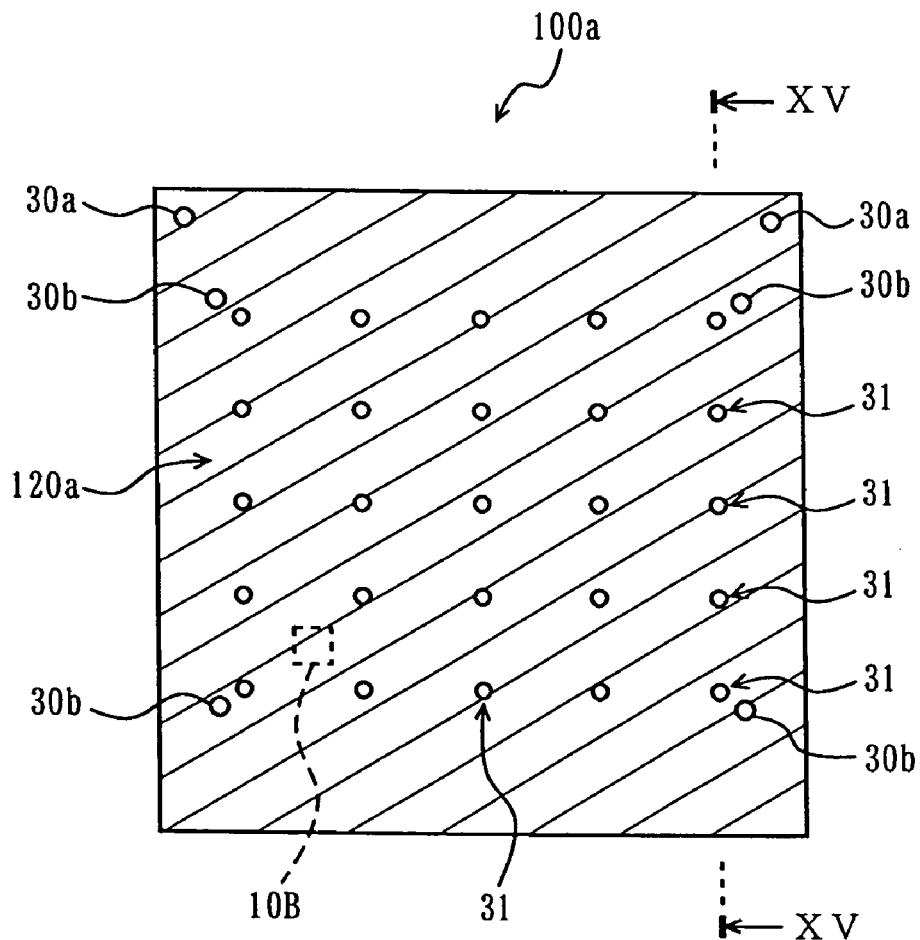
FIG. 14 is a plan view of a pallet according to a second embodiment of the present invention.
Figure 15:
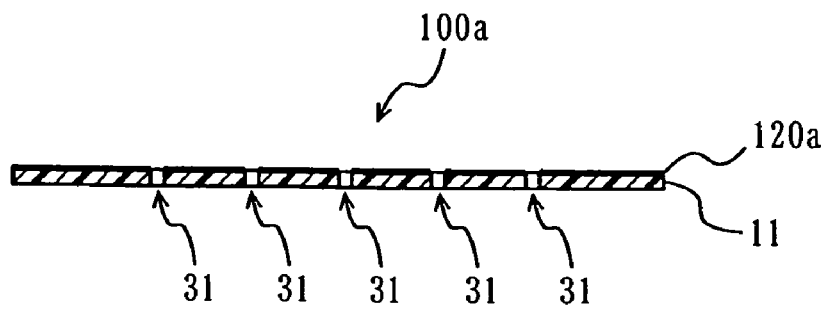
FIG. 15 is a cross-sectional view of the pallet taken along a line XV—XV of FIG. 14.

FIG. 14 is a top view of an FPC-holding surface of the pallet 100*a*. FIG. 15 is a cross-sectional view of the pallet 100*a* taken along a line XV—XV of FIG. 14. The pallet 100*a* is structured such that an adhesive section 120*a* formed of an adhesive material is bonded onto a plate-like base plate 11 which serves as a main body. The base plate 11 is formed of metals with a high thermal conductivity such as aluminum or magnesium (other materials with high stiffness may also be used), or of resin such as glass epoxy resin.

As the adhesive material, in the case where heat resistance is required, silicon rubber is preferably used, and in the case where heat resistance is not required, polyurethane rubber may be used. In addition, other adhesive materials may also be used as long as the material is applicable. In FIG. 14, the adhesive section 120*a* is hatched for better visibility.

The pallet 100*a* has positioning through holes 30*a* provided therein and through holes 30*b* provided therein for positioning an FPC to be held. In addition, as shown in FIGS. 14 and 15, the pallet 100*a* also has a multitude of through holes 31 provided therein into which push-up pins are inserted to peel an FPC being held. Note that where needed, the through holes 30*a*, 30*b*, and 31 are referred to as "positioning through holes 30*a*", through holes 30*b* for FPC", and "through holes 31 for table pins", respectively, for distinction.

Figure 16:
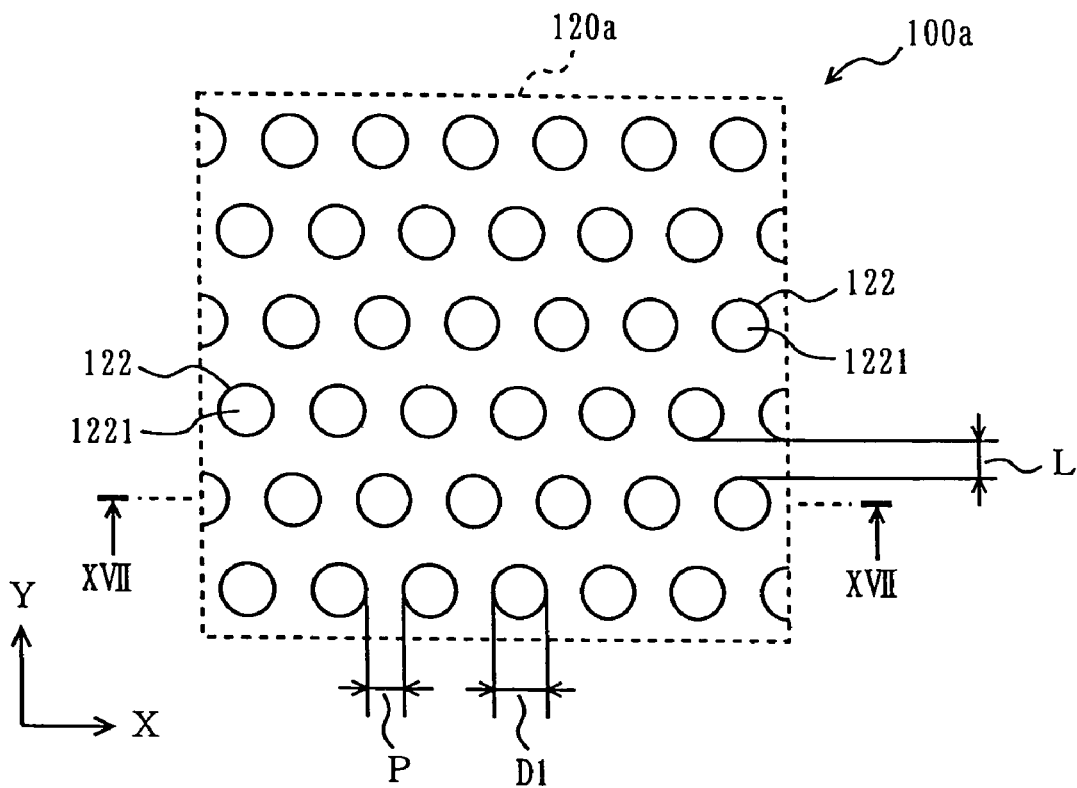
FIG. 16 is an enlarged view of a rectangular region in the pallet shown in FIG. 14.
Figure 17:
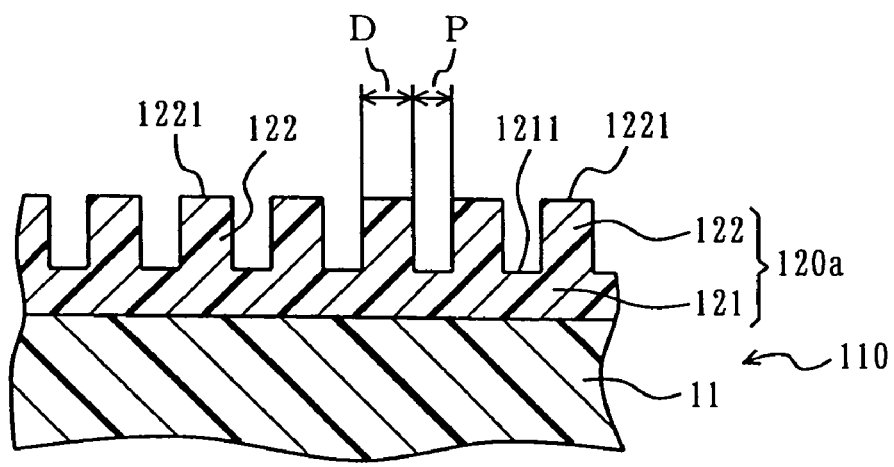
FIG. 17 is a cross-sectional view of the rectangular region taken along a line XVII—XVII of FIG. 16.

FIG. 16 is an enlarged view of a rectangular region 10B of the adhesive section 120*a* indicated by a dotted line in FIG. 14. FIG. 17 is a cross-sectional view of the rectangular region 10B taken along a line VIIX—VIIX of FIG. 16. The adhesive section 120*a* has a base section 121 bonded over the top surface of a base plate 11; and a multitude of column-shaped holding elements 122 (as shown in FIG. 16) which protrude from a base surface 1211 (i.e., the top surface of the base section 121). The base section 121, which includes the base surface 1211, and the holding elements 122 are integrally formed using an adhesive material. Specifically, the holding elements 122 are formed so as to protrude from a main body 110 composed of the base plate 11 and the base section 121. Each holding element 122 has a planar holding surface 1221 at its top end, to which an FPC (a flexible circuit board) is adhered.

In the present embodiment, the holding elements 122 each are preferably 1.2 mm in diameter (D) and 1.5 mm in height (H). The pitch (P) between the holding elements 122 in the X direction is 2 mm, and the distance (L) in the Y direction between the alignments of the holding elements 122 arranged in the X direction is 2 mm.

Figure 18:
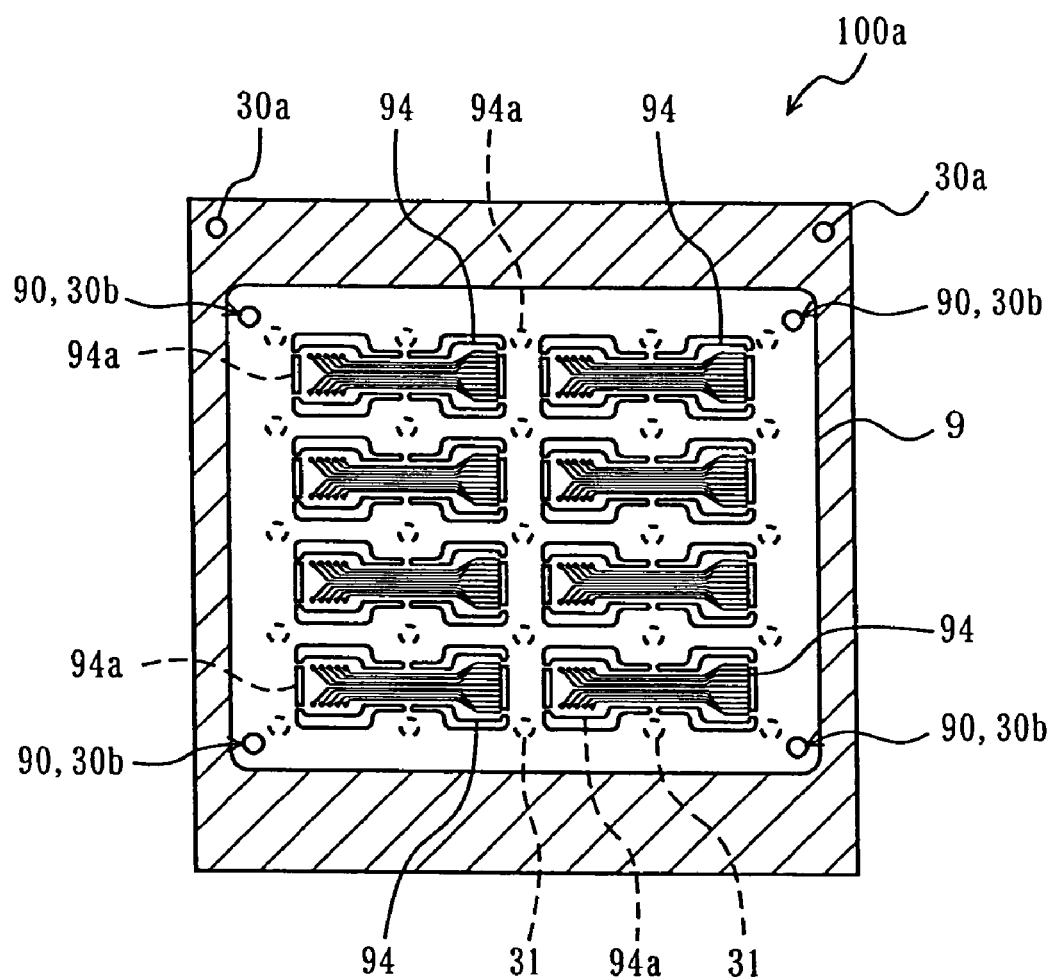
FIG. 18 is a plan view of the pallet shown in FIG. 14 having an FPC being held thereto.

FIG. 18 is a diagram illustrating the pallet 100 having an FPC 9 being held thereto. The back side (the surface to be held) of the FPC 9 is flat, and the FPC 9 is securely held by the holding surfaces 1221 of the holding elements 122 having the same height from the flat base surface 1211. In the present example, on the FPC 9 wiring of a plurality of FPC segments 94 is integrally provided, and each FPC segment 94 has a mounting region 94*a* where IC packages (which include various electronic components, such as IC bare chips, capacitors, resistors, coils, and connectors, and which are hereinafter referred to as "electronic components") are mounted. The FPC 9 has positioning holes 90 provided in its four corners, which match the through holes 30*b* for FPC provided in the pallet 100*a*. In a state in which the through holes 30b for FPC are matching the holes 90, the through holes 31 for table pins are positioned between the FPC segments 94.

Figure 19:
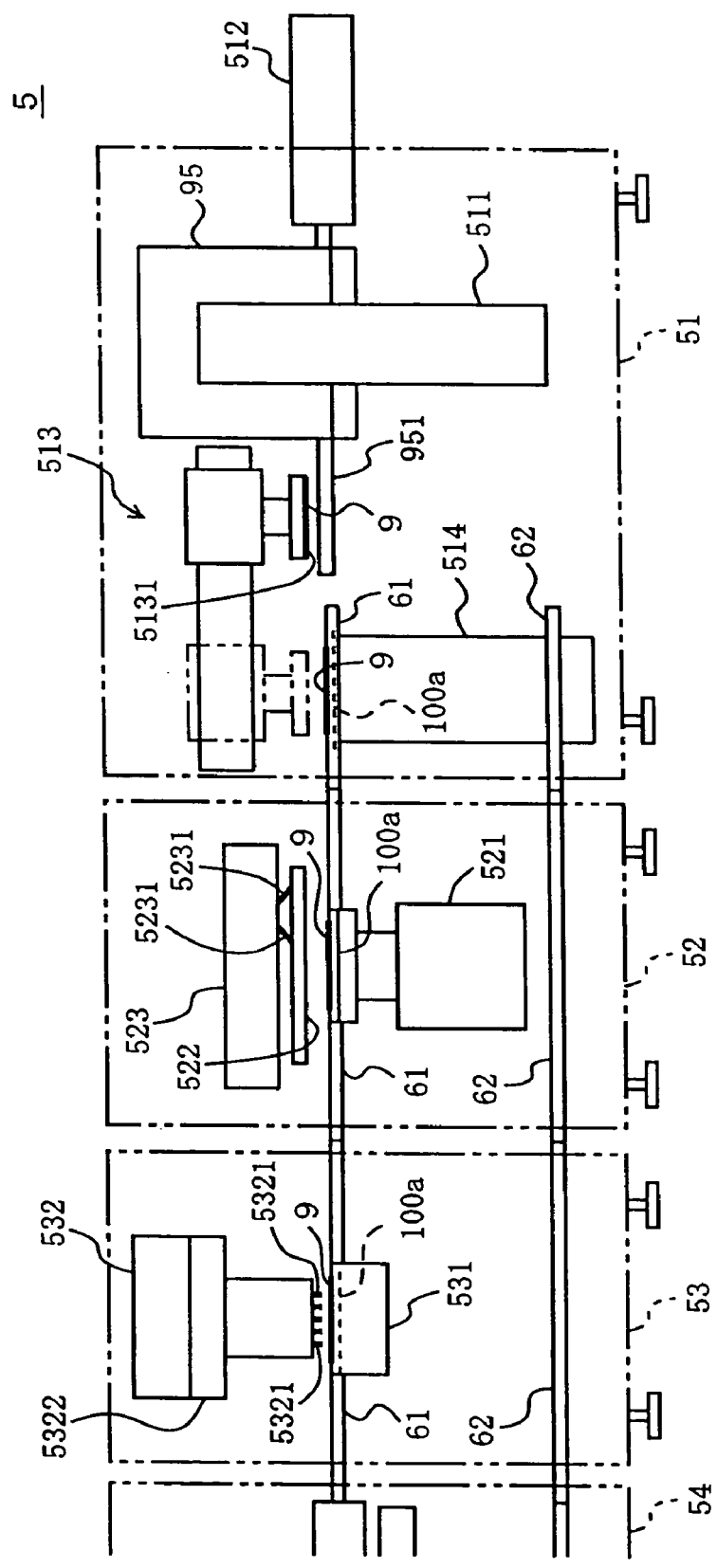
FIG. 19 is a diagram illustrating a part of a configuration of a mounting system.
Figure 20:
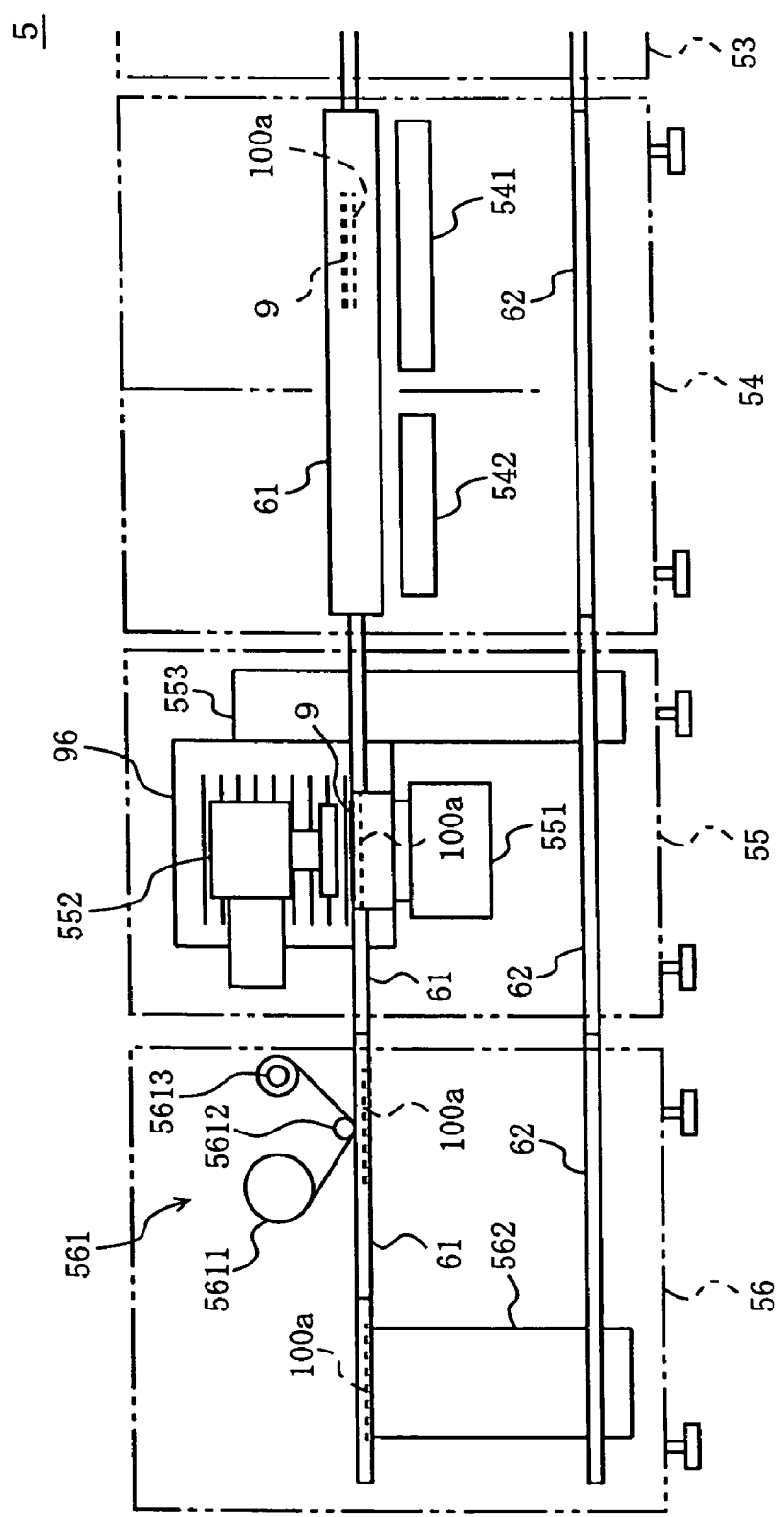
FIG. 20 is a diagram illustrating the rest of the configuration of the mounting system.

Referring now to FIGS. 19 and 20, there is described a mounting system for mounting electronic components on mounting regions 94a of FPC segments 94 of an FPC 9 being held onto a pallet 100a. A mounting system 5 includes, from the upstream (on the right side in the drawings) of the processing order, a loader 51, a printing apparatus 52, an installation apparatus 53, a reflow apparatus 54, an unloader 55, and a cleaning apparatus 56. A forward conveyor 61 for a pallet 100a is disposed around the center of each apparatus, and a reverse conveyor 62 for the pallet 100a is disposed at the lower part of each apparatus. The loader 51 places an FPC 9 on a pallet 100a. The printing apparatus 52 prints solder paste on to the FPC 9. The installation apparatus 53 installs electronic components on the FPC 9. The reflow apparatus 54 causes the solder paste to melt and solidify to fix the electronic components on the FPC 9. The unloader 55 peels the FPC 9 off the pallet 100a. The cleaning apparatus 56 cleans the pallet 100a.

In the loader 51, a plurality of trays 951 are stored in a storage 95 so as to be stacked vertically, and each tray 951 has an FPC 9 placed thereon. The loader 51 includes an elevation mechanism 511 for moving the storage 95 up and down; a projection mechanism 512 for transferring of a single tray 951 into and from the storage 95; a transfer mechanism 513 for taking an FPC 9 out of the tray 951 projected out by suction; and a pallet moving mechanism 514 for moving a pallet 100a to the start point of the forward conveyor 61 from the end point of the reverse conveyor 62.

A holding surface 5131a of the transfer mechanism 513 for holding an FPC 9 is a flat surface having a multitude of suction openings provided therein. The transfer mechanism 513 takes an FPC 9 out of a tray 951 by suction, and then places the FPC 9 on a pallet 100a on the conveyor 61. At this point, while the FPC 9 is positioned with reference to the through holes 30b of the pallet 100a and the holes 90 of the FPC 9, the holding surface 5131a moves down to press the entire FPC 9 against the pallet 100a by a predetermined pressure. By this, the entire FPC 9 is held by adhesion to an adhesive section 120a (specifically, holding surfaces 1221 of holding elements 122) of the pallet 100a. The pallet 100a having the FPC 9 being held thereto is carried in the printing apparatus 52 by the conveyor 61.

The printing apparatus 52 includes an elevation mechanism 521 for positioning and holding the pallet 100a with reference to the positioning through holes 30a (see FIG. 14) (i.e., by inserting pins into the positioning through holes 30a) and pushing up the pallet 100a towards a screen mask 522 provided above; and a printing mechanism 523 for spreading solder paste on the screen mask 522 back and forth with squeegees 5231. The printing mechanism 523 moves the squeegees 5231 back and forth with the FPC 9 on the pallet 100a being abutted against the screen mask 522, whereby the solder paste is attached to the FPC 9 through openings of the screen mask 522. The FPC 9 having the solder paste printed thereto is allowed to move down along with the pallet 100a and then they are carried in the installation apparatus 53 by the conveyor 61.

The installation apparatus 53 includes a holding mechanism 531 for holding the pallet 100a with reference to the though holes 30a; and an installation mechanism 532 for installing electronic components on the FPC 9 being adhered onto the pallet 100a. The installation mechanism 532 includes a plurality of nozzles 5321 for sucking electronic components; and a nozzle moving mechanism 5322 which moves up and down and which allows the nozzles 5321 to move in a horizontal plane. The installation mechanism 532 receives electronic components from a supply mechanism (not shown; which arranges and prepares electronic components on tapes or trays) and installs the electronic components on the solder paste provided on the FPC 9. The FPC 9 having the electronic components installed thereon is carried together with the pallet 100a in the reflow apparatus 54, as shown in FIG. 20, by the conveyor 61.

As shown in FIG. 20, the reflow apparatus 54 includes a heating section 541 for preheating and heating the FPC 9 being adhered to the pallet 100a which has been carried by the conveyor 61; and a cooling section 542 for cooling the FPC 9 by air. The FPC 9 is heated and cooled while it is being carried, to cause the solder paste to melt and solidify, whereby the electronic components are fixed on the FPC 9. As shown in FIG. 18, since the entire FPC 9 is being adhered to the adhesive section 120a of the pallet 100a, even if heating by hot air and cooling by cold air are performed, it is possible to prevent the FPC 9 from partially peeling off the adhesive section 120a. After reflow, the FPC 9 is carried together with the pallet 100a in the unloader 55.

The unloader 55 includes a holding mechanism 551 for holding the pallet 100a; a transfer mechanism 552 for receiving the FPC 9 from the pallet 100a; an elevation mechanism 553 for moving up and down a storage 96 for storing the FPC 9; and a projection mechanism (not shown) for transferring of a tray into and from the storage 96. The storage 96 has a plurality of trays stacked vertically. The projection mechanism projects out a tray, the transfer mechanism 552 receives the FPC 9 from the pallet 100a and places the FPC 9 on the tray, and then the projection mechanism retracts the tray to the storage 96.

Figure 21:
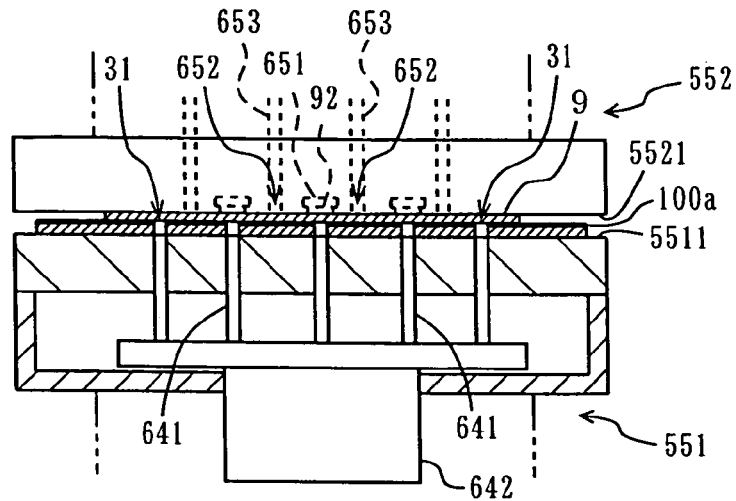
FIG. 21 is an illustrative diagram of an operation of receiving an FPC from a pallet performed by a transfer mechanism shown in FIG. 20.
Figure 22:
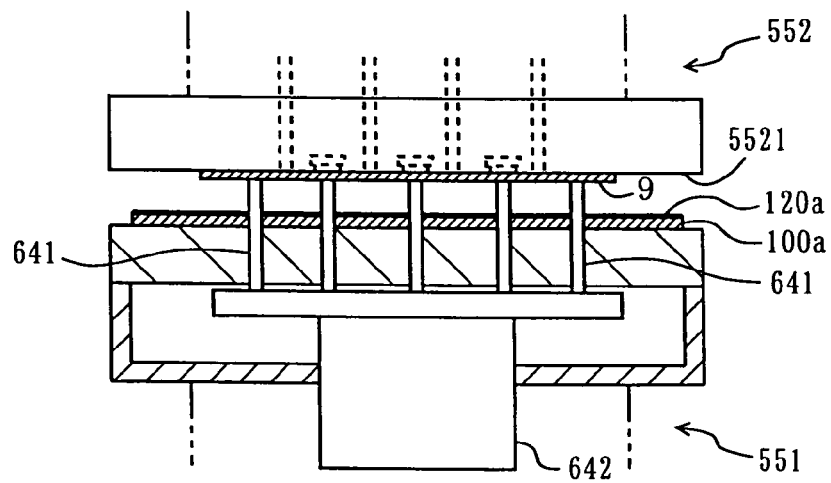
FIG. 22 is a further illustrative diagram of the operation of receiving an FPC from a pallet performed by the transfer mechanism shown in FIG. 20.

Referring to FIGS. 21 and 22, there is described the operation that the transfer mechanism 552 receives an FPC 9 from a pallet 100a. As shown in FIG. 21, in the holding mechanism 551, push-up pins 641 for peeling the FPC 9 are disposed, and the push-up pins 641 are pushed up above a holding surface 5511 by a shaft 642 moving up. The holding mechanism 551 positions and holds the pallet 100a with reference to positioning through holes 30a (see FIG. 14), whereby the push-up pins 641 and through holes 31 match up with each other (see FIGS. 14 and 15).

As shown in FIG. 21, a depression 651 is formed in a holding surface 5521 (underside) on the side of the transfer mechanism 552 to accommodate electronic components 92 mounted on the FPC 9. In addition, the holding surface 5521 has suction openings 652 formed therein for sucking the FPC, and in the transfer mechanism 552 suction channels 653 are formed.

When the transfer mechanism 552 receives the FPC 9, first, as shown in FIG. 21, the holding surface 5521 of the transfer mechanism 552 moves down and abuts against the FPC 9 and then suction by the suction openings 652 on the side of the transfer mechanism 552 begins. Subsequently, the shaft 642 of the holding mechanism 551 moves up, thereby causing the push-up pins 641 to push up the FPC 9. At this point, the holding surface 5521 of the transfer mechanism 552 moves up along with the movement of the push-up pins 641, as shown in FIG. 22, whereby the FPC 9 is peeled completely off the adhesive section 120a of the pallet 100a and sucked to the holding surface 5521 of the transfer mechanism 552. Note that in FIGS. 21 and 22, some portions are hatched for better visibility but not for indicating cross sections.

Referring back to FIG. 20, the pallet 100a off which the FPC 9 has been peeled is carried in the cleaning apparatus 56 by the conveyor 61. The cleaning apparatus 56 includes a cleaning mechanism 561 for cleaning the pallet 100a; and a pallet moving mechanism 562 for moving the pallet 100a to the start point of the reverse conveyor 62 from the end point of the forward conveyor 61. The cleaning mechanism 561 unreels a cloth from a cloth roll 5611 around which a detergent-soaked cloth is wound and allows the cloth to abut against the adhesive section 120a of the pallet 100a by a roller 5612, and then winds the cloth around a shaft 5613 to take up the cloth. In this manner, dust attached to the adhesive section 120a is removed. The cleaned pallet 100a is moved down by the pallet moving mechanism 562 and transferred to the conveyor 62, carried in the loader 51 from the cleaning apparatus 56, and then transferred to the conveyor 61 by the pallet movement mechanism 514 of the loader 51.

As described above, the pallet 100a substantially holds the entire FPC 9 by adhesion, and thus when mounting electronic components, accidental peeling of the FPC 9 off the pallet 100a can be prevented.

Meanwhile, as shown in FIGS. 16 and 17, the adhesive section 120a has a multitude of holding elements 122 arranged on the main body 110 with spaces (pitches P) therebetween, and thus where necessary, an FPC 9 being held can be easily peeled. Though the exact principles of easy peeling are not clearly known, when peeling an FPC 9 off a pallet 100a, the peeling boundary is divided into small pieces and peeling from one holding surface 1221 is completed in a short period of time. In other words, since peeling is performed intermittently, the force that acts on the peeling boundary present the underside of the FPC 9 is distributed in terms of geometry and time, thereby preventing a great force from temporarily concentrating on the FPC 9.

Further, since the holding surface 1221 of each holding element 122 has a circular shape, regardless of the direction in which an FPC 9 is peeled, peeling can be easily performed from a regional portion on the holding surfaces 1221. Accordingly, in view of individual holding surfaces 1221, peeling of the FPC 9 can be easily performed.

Note that the shape of the holding surfaces 1221 of the holding elements 122 is not limited to circular; any shape may be employed as long as the shape allows for the aforementioned intermittent peeling and geometric distribution of the force that acts on the peeling boundary present at the underside of an FPC 9 and prevents a great force from temporarily concentrating on the FPC 9. Examples of other shapes include a polygon made up of a plurality of straight lines and indefinite shapes made up of independently of or a combination of a plurality of curves, free curves, and straight lines.

Figure 23:
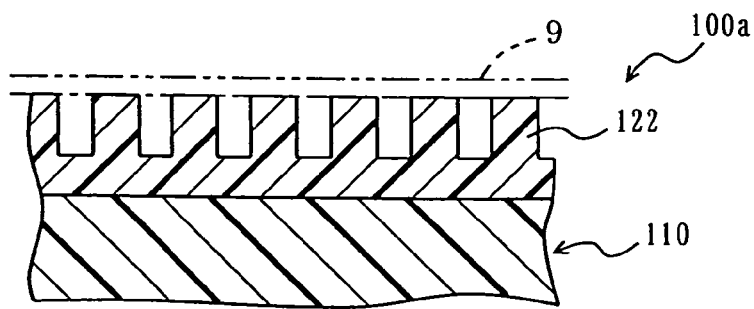
FIG. 23 is an illustrative diagram of a deformation state of holding elements shown in FIGS. 16 and 17.

Moreover, since a plurality of holding elements 122 protruding from the main body 110 are elastic, as shown in FIG. 23, the influence of the thermal expansion difference between an FPC 9 and a pallet 100a caused by heat during reflow can be accommodated by deformation of the holding elements 122. Accordingly, the FPC 9 can be securely held onto the pallet 100a during reflow. In particular, since the number of the case of treating large FPCs which have a multitude of FPC segments has been increased in recent years, the thermal expansion difference between an FPC and a pallet caused during a heating process such as reflow may be great, and therefore it is important to prevent peeling of the FPC caused by deformation of holding elements 122.

The shape and alignment of holding elements 122 are appropriately determined by the size of an FPC 9 to be held and the type of processing performed on the FPC 9. In the case of a typical circuit board having a width (specifically, the horizontal and vertical widths of the circuit board) in the range of 10 mm to 350 mm, it is preferred that the diameter and height of holding elements 122 be in the range of 1 mm to 30 mm and in the range of 0.1 mm to 5 mm, respectively. Further, in the case where heating is performed such as reflow (in particular, in the case where the width of a circuit board is in the range of 100 mm to 350 mm), in order to accommodate the influence of the thermal expansion difference between an FPC 9 and a pallet 100a, it is preferred that the diameter (D) and height (H) of holding elements 122 be in the range of 1 mm to 3 mm and in the range of 0.5 mm to 5 mm, respectively. Note that the above conditions are suitable in the case where a rubber with an Hs hardness in the range of 20 to 50 is used for holding elements 122, and the Hs hardness of the rubber is most preferably on the order of 30.

Figure 24:
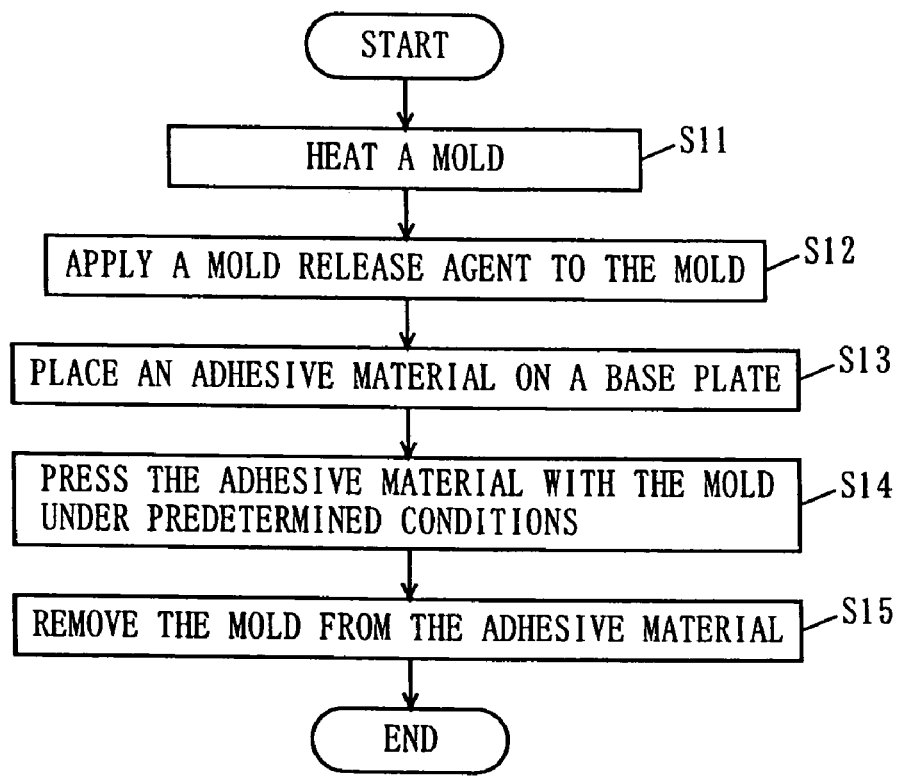
FIG. 24 is a flowchart showing production process of the pallet shown in FIG. 14.

Referring now to FIGS. 24 to 28, there is described production of a pallet 100a. FIG. 24 shows the steps for producing the pallet 100a in chronological order, and FIGS. 25 to 28 are diagrams illustrating stepwise production of the pallet 100a.

Figure 25:
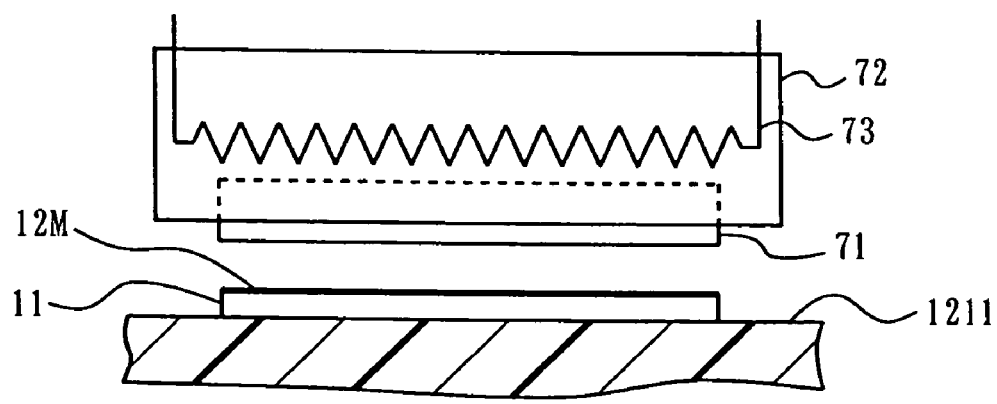
FIG. 25 is an illustrative diagram of a production method of the pallet shown in FIG. 14.

First, in step S11, as shown in FIG. 25, a mold 71 for forming holding elements 122 is prepared and mounted to a pressing apparatus 72 having a heater 73 provided thereto. The mold 71 is then preheated by the heater 73.

Figure 26:
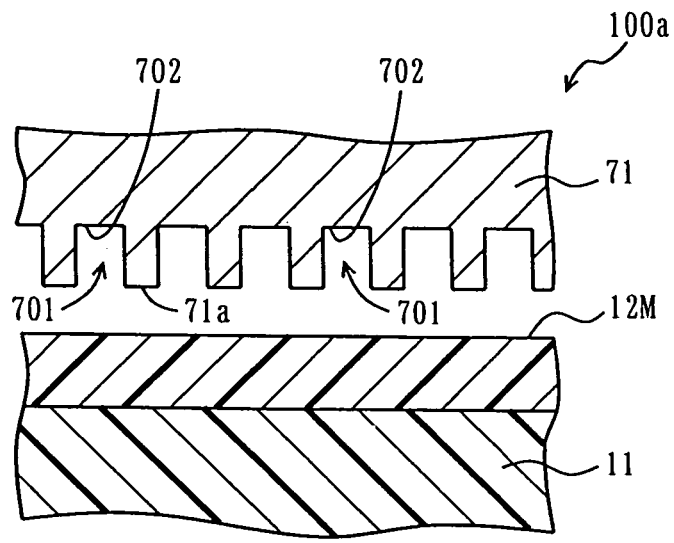
FIG. 26 is an enlarged view of an adhesive material and a mold for forming holding elements of the pallet shown in FIG. 14.

In step S12, after preparation has been completed in the pressing apparatus 72, a mold release agent is applied to the mold 71. As is clear from an enlarged cross-sectional view of an underside 71a of the mold 71 and an adhesive material 12M close to the underside 71a, as shown in FIG. 26, a multitude of cylindrical holes 701 for forming a plurality of holding elements 122 are provided in the underside 71a of the mold 71, and a bottom surface 702 of each hole 701 is formed in a planar surface.

In step S13, a primer (a bonding agent) is applied onto a base plate 11, whereby an adhesive material 12M is placed. The adhesive material 12M may be a solid material, such as a rubber sheet, or a liquid adhesive material, for example. In addition, a mold release agent may be applied to the adhesive material 12M, where necessary.

Figure 27:
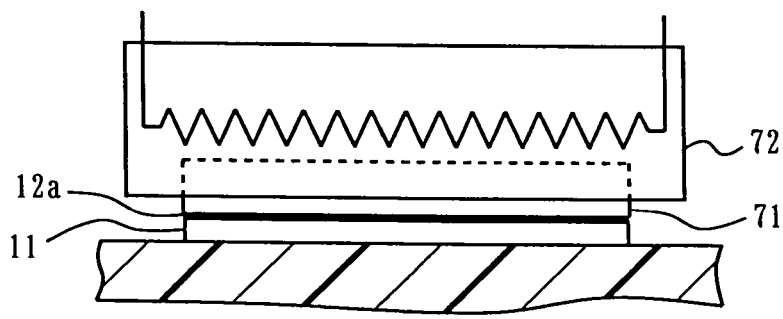
FIG. 27 is an illustrative diagram of a forming method of the holding elements using the mold shown in FIG. 26.
Figure 28:
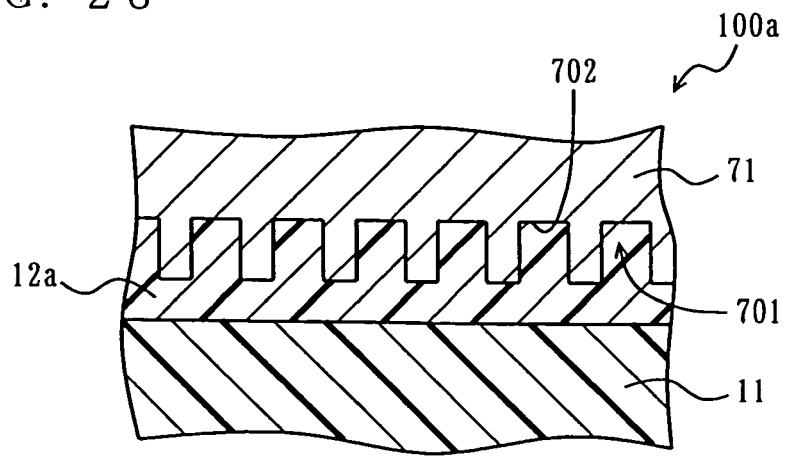
FIG. 28 is an enlarged view of the holding elements having been formed using the mold shown in FIG. 26.

In step S14, as shown in FIG. 27, the adhesive material 12M is heated and pressed with the mold 71 by a predetermined force, at a predetermined temperature, for a predetermined time, whereby a surface of the adhesive material 12M is transformed into a shape corresponding to a protrusion and depression pattern of the underside 71a of the mold 71. FIG. 28 is an enlarged cross-sectional view of the bottom part of the mold 71 and the adhesive material 12M after pressing. Specifically, in this step, the adhesive material 12M becomes fluid by heat, and as shown in FIG. 28, the adhesive material 12M pushes out air in the holes 701 of the mold 71 and is sufficiently guided to the bottom surfaces 702. Note that a rubber sheet, which serves as the adhesive material 12M, has sulfur and other additives contained therein previously, and thus vulcanization (so-called first vulcanization) is concurrently performed on the adhesive material 12M by heating during pressing.

In step S15, the mold 71 in a state shown in FIG. 28 is cooled. When the adhesive material 12M, which has become fluid in step S14, is cured and returns to an elastic state, the mold 71 is caused to move up and detach from the adhesive material 12M, thereby obtaining a multitude of column-shaped holding elements 122, as shown in FIG. 17. Since the bottom surfaces 702 of the holes 701 of the mold 71 is planar, the surfaces of the top ends of the holding elements 122 have planar surfaces which ensure adhering of an FPC 9. In addition, where necessary, the aforementioned through holes may be provided in the palette 100a.

As described above, a multitude of holding elements 122 of a pallet 100a can be formed easily in a short period of time, only by pressing a heated mold 71 against an adhesive material 12M. It is also possible to incorporate into a mold 71 a mechanism for forming various through holes for a pallet 100a concurrently with the formation of an adhesive section 120a.

To form column-shaped holding elements 122, the shape of the side surfaces of holes 701 of a mold 71 needs to be cylindrical. Thus, by using an end mill when producing a mold 71, holes 701 can be provided easily and efficiently, which reduces the production costs of the mold 71. Another example of holes that can be easily provided using tools includes a hole having such a shape that four corners are chamfered and rounded when the hole is viewed from the opening side.

<First Alternative>

Figure 29:
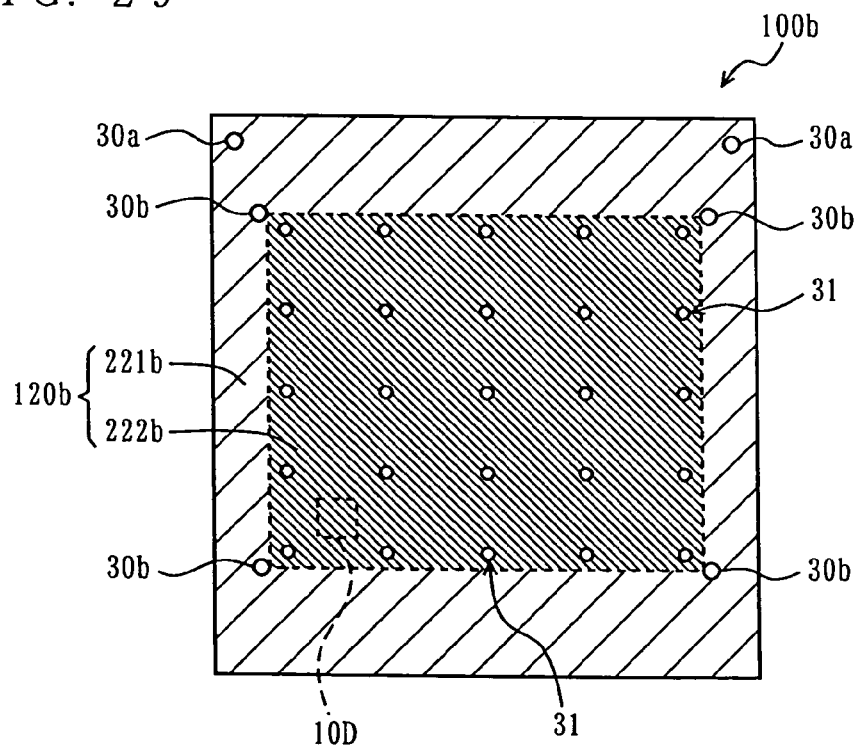
FIG. 29 is a plan view of a pallet according to a first alternative of the second embodiment of the present invention.
Figure 30:
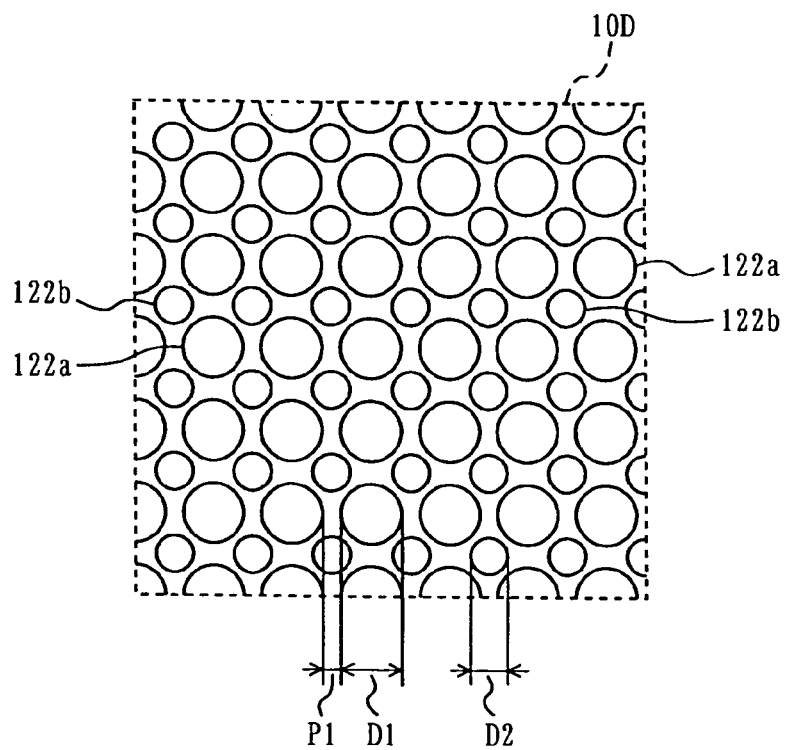
FIG. 30 is an enlarged view of a rectangular region in the pallet shown in FIG. 29.
Figure 31:
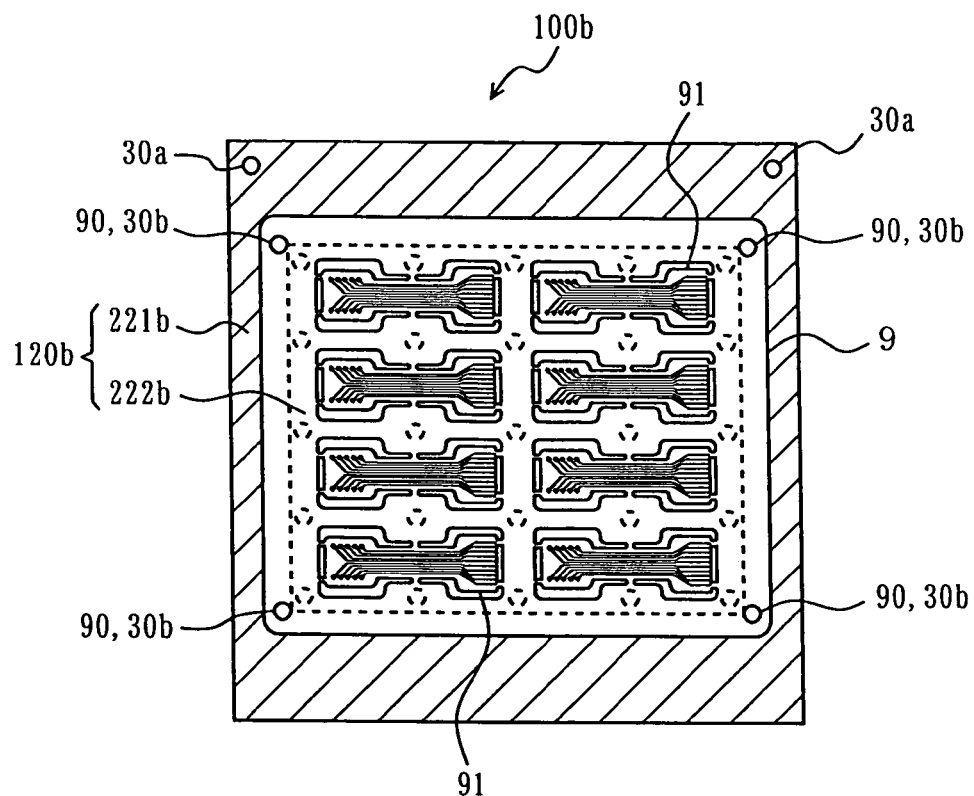
FIG. 31 is a plan view of the pallet shown in FIG. 29 having an FPC being held thereto.

Referring to FIGS. 29, 30, and 31, there is described a pallet 100b which is a first alternative of the substrate holder for carrying an FPC, according to the second embodiment of the present invention. FIG. 29 is a top view of an FPC-holding surface of the pallet 100b. The pallet 100b has an adhesive section 120b formed on a base surface 1211 of a base plate 11 using an adhesive material, as with a pallet 100a shown in FIG. 14.

Note that while an adhesive section 120a is composed of a single region, the adhesive section 120b is composed of a first holding region 221b provided in the perimeter and a second holding region 222b provided in the center. The first holding region 221b and the second holding region 222b have holding elements which are different in size and arrangements therebetween. In FIG. 29, different hatching patterns are intended to indicate that the holding elements have different sizes and different arrangements, but not to indicate cross sections. Other configurations are the same as those of a pallet 100a shown in FIG. 14.

In the first holding region 221b, holding elements 122 are formed, as with those of the adhesive section 120a shown in FIG. 16. In the second holding region 222b, on the other hand, holding elements 122a and 122b (see FIG. 30) are arranged at higher densities than those in the first holding region 221b (the adhesive section 120a). That is, the pallet 100b is constructed such that in the pallet 100a the central portion is replaced with the second holding region 222b.

FIG. 30 is an enlarged view of a rectangular region 10D of the second holding region 222b indicated by a dotted line in FIG. 29. In the second holding region 222b, column-shaped holding elements 122a and 122b having different diameters (D1) and (D2), respectively (D1>D2), are arranged alternately. In the present example, the holding elements 122a are 1.5 mm in diameter (D1) and arranged with a 2 mm pitch (P1). The holding elements 122b are 1 mm in diameter (D2), and each holding element 122b is arranged to be surrounded by four holding elements 122a. In order to securely hold a flat FPC 9, all the holding elements 122, 122a and 122b are formed to have the same height from the base surface 1211.

By thus arranging the holding elements 122, 122a, and 122b in the first and second holding regions 221b and 222b, the total area of the holding surfaces (i.e., the top end surfaces) of the holding elements 122 becomes 28.3% of the total area of the first holding region 221b, and the total area of the holding surfaces of the holding elements 122a and 122b becomes 63.8% of the total area of the second holding region 222b. In this manner, tackiness can be regulated by adjusting the proportion of the area of holding surfaces per unit area, and the tackiness of the second holding region 222b becomes higher than that of the first holding region 221b. Note that the tackiness indicates a value which is equivalent to a load required to peel an object having been adhered to something under predetermined conditions, and which indicates a tackiness level.

In the second holding region 222b, by providing holding elements with different diameters, the proportion of the area of holding surfaces can be increased more easily than the case where holding elements with the same diameter are arranged.

FIG. 31 is a diagram illustrating a pallet 100b shown in FIG. 29 having adhered thereto an FPC 9 which is the same as that shown in FIG. 18. The perimeter of the FPC 9 lies over a first holding region 221b, while the central portion of the FPC 9 lies over the second holding region 222b. That is, a region of the pallet 100b where the FPC 9 is not being held is present only in the first holding region 221b having low tackiness, and therefore when performing solder printing in the mounting system 5 shown in FIGS. 19 and 20, a screen mask 522 is weakly adhered to the first holding region 221b. This facilitates removal of the screen mask 522 from the pallet 100b.

On the other hand, the central portion of the FPC 9 is being strongly held to the second holding region 222b and also the perimeter of the FPC 9 is being held to the first holding region 221b, and therefore it is possible to prevent the FPC 9 from peeling due to air currents during reflow. In addition, since the FPC 9 is held by a multitude of holding elements arranged with spaces therebetween, easy peeling is achieved and the influence of the thermal expansion difference between the FPC 9 and the pallet 100b can be accommodated, as with the case of the pallet 100a of FIG. 14.

The production method for the pallet 100b shown in FIG. 29 is the same as that for the pallet 100a shown in FIG. 14, except for changing the configuration of holes of a mold in accordance with the configuration of holding elements of the first and second holding regions 221 and 222.

Moreover, the pallet 100b according to the present alternative can be applied to any of the pallets 1a to 1d according to the foregoing first embodiment. Specifically, a guide section 14 of the pallets 1a to 1d may be constructed with the first holding region 221b and a holding section 13 may be constructed with the second holding region 222b. Although in the first and second holding regions 221b and 222b, the holding elements 122, 122a, and 122b are disposed in a spaced-apart arrangement at a predetermined pitch, the amount of spaces is small and in addition the holding elements 122, 122a, and 122b are distributed uniformly, and thus the squeegee 231 can be supported uniformly.

<Second Alternative>

Figure 32:
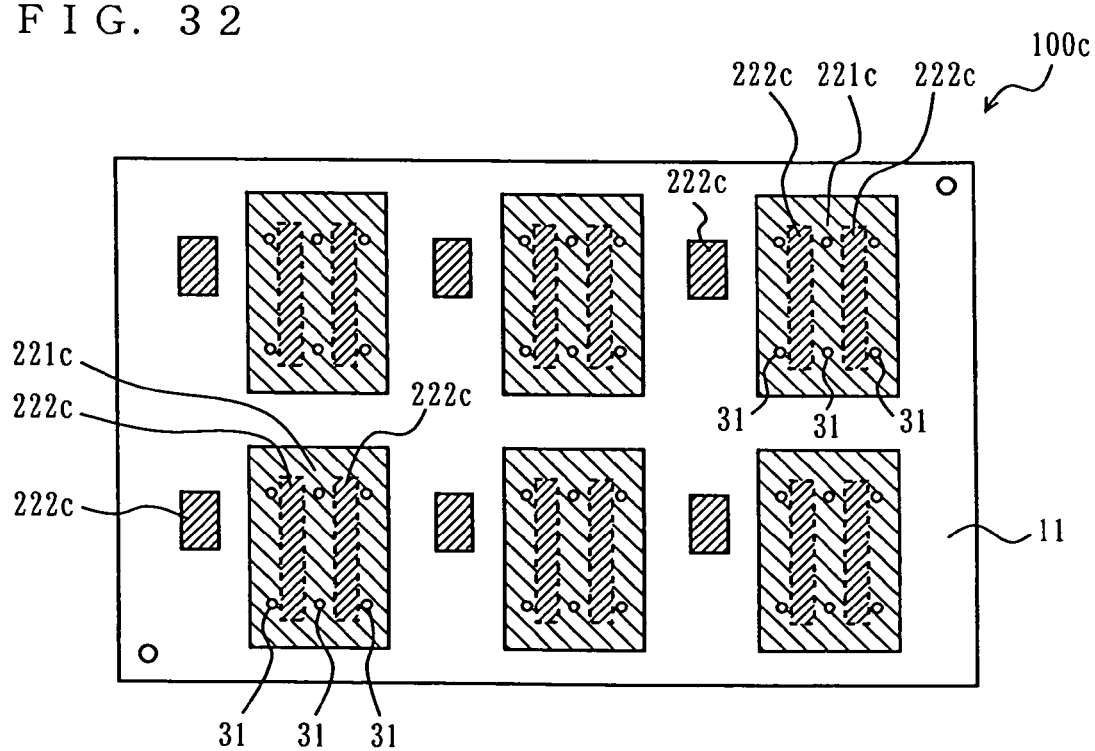
FIG. 32 is a plan view of a pallet according to a second alternative of the second embodiment of the present invention.
Figure 33:
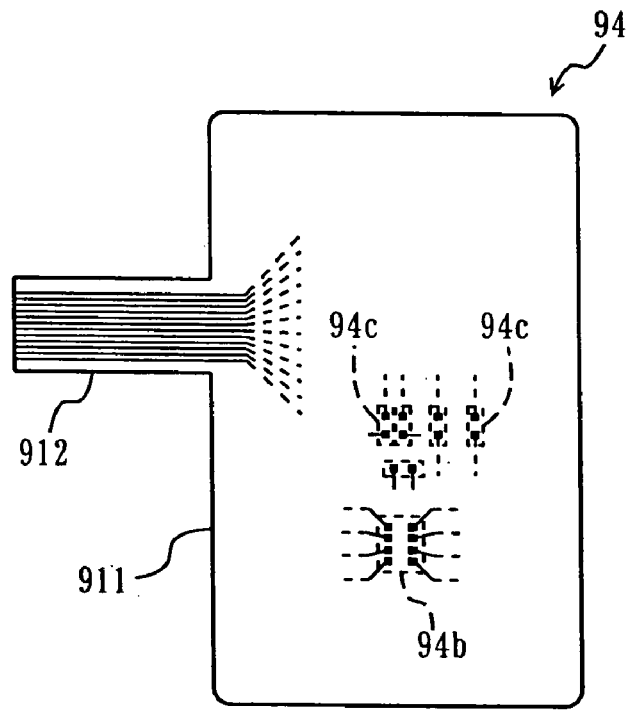
FIG. 33 is a plan view of an FPC segment to be held onto the pallet shown in FIG. 32.
Figure 34:
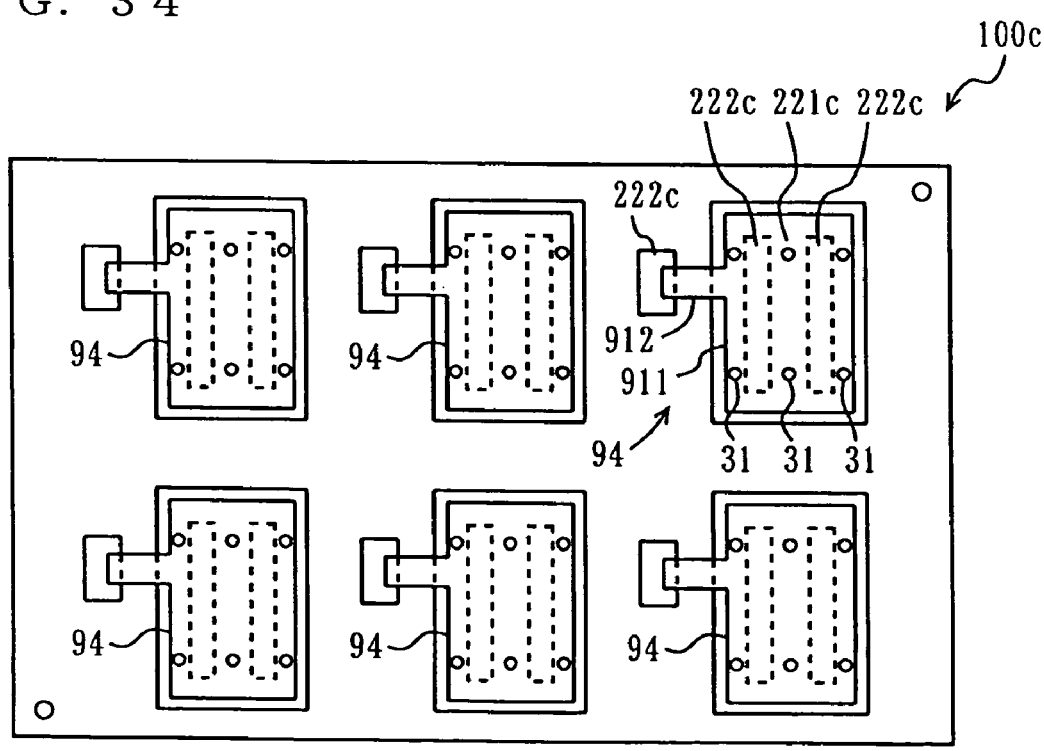
FIG. 34 is a plan view of the pallet shown in FIG. 32 having the FPC segments shown in FIG. 32 being held thereto.

Referring to FIGS. 32, 33, and 34, there is described a pallet 100c which is a second alternative of the substrate holder for carrying an FPC, according to the second embodiment of the present invention. The pallet 100c holds a plurality of FPC segments separately, and has a plurality of combinations made up of a first holding region 221b having low tackiness in which holding elements 122 shown in FIG. 16 are formed, and a second holding region 222b having relatively high tackiness in which holding elements 122a and 122b shown in FIG. 30 are formed. Note that in the pallet 100c the first and second holding regions have different configurations to those in a pallet 100b, and thus are referred to as a "first holding region 221c" and a "second holding region 222c", respectively, for distinction. In FIG. 32 too, the first holding region 221c and the second holding region 222c are indicated by different hatching patterns, and in a non-hatched region a base surface 1211 which is a surface of a base plate 11 is exposed. That is, an adhesive section is present only in the hatched first and second holding regions 221c and 222c. In addition, the first holding region 221c has a plurality of through holes 31 provided therein into which push-up pins are to be inserted.

FIG. 33 is an external view of an FPC segment 94 to be held onto the pallet 100c. The FPC segment 94 has such a configuration that a lead section 912 is protruded from a mounting section 911. The mounting section 911 has a mounting region 94b where an IC package is mounted and mounting regions 94c where resistors, capacitors, and the like are mounted.

FIG. 34 is a diagram illustrating a pallet 100c having a plurality of FPC segments 94 being held thereto by adhesion. A mounting section 911 of each FPC segment 94 is held to a region in which two second holding regions 222c are encompassed in a first holding region 221c, and an end of each lead section 912 is held to a small second holding region 222c.

The manner in which electronic components are mounted on the FPC segments 94 using the pallet 100c shown in FIG. 32 is the same as that in the case of using a pallet 100a shown in FIG. 14, except that a plurality of FPC segments 94 are held onto the pallet 100c. By using the pallet 100c, substantially the entire FPC segment 94 can be held by adhesion, and thus it is possible to prevent the FPC segment 94 from peeling off the pallet 100c during mounting of electronic components. In particular, since the lead section 912 is held to the second holding region 222c having high tackiness, peeling of the FPC segment 94 from the lead section 912 can be prevented. In addition, the major part of a region where the FPC segments 94 are not being held has no tackiness, and thus screen-printing can be performed easily.

The pallet 100c shown in FIG. 32 has through holes 31 for push-up pins provided in each first holding region 221c. Thus, an FPC segment 94 is peeled off the pallet 100c in such a manner that the FPC segment 94 is mechanically peeled off the first holding region 221c having low tackiness with push-up pins, which enables smooth peeling without putting excess force on the FPC segment 94. Accordingly, while the second holding region 222c provides sufficient tackiness to securely hold an FPC segment 94, easy peeling of the FPC segment 94 is achieved.

In addition, by holding an FPC 9 by a multitude of holding elements arranged with spaces therebetween, easy peeling is achieved and the influence of the thermal expansion difference between the FPC 9 and the pallet 100c can be accommodated, as with the case of the pallet 100a of FIG. 14. Further, since a mounting section 911 of an FPC segment 94 is held to a first holding region 221c and second holding regions 222c which are formed of an adhesive material and present in one region, and the second holding regions 222c are encompassed in the first holding region 221c, the FPC segment 94 can be smoothly peeled from its perimeter.

The production method for the pallet 100c is the same as that for the aforementioned pallets 100a and 100b, except that an adhesive section is provided in a part of a surface of a base plate 11. In addition, the pallet 100c according to the present alternative can be applied to any of the pallets 1a to 1d according to the foregoing first embodiment.

<Third Alternative>

Figure 35:
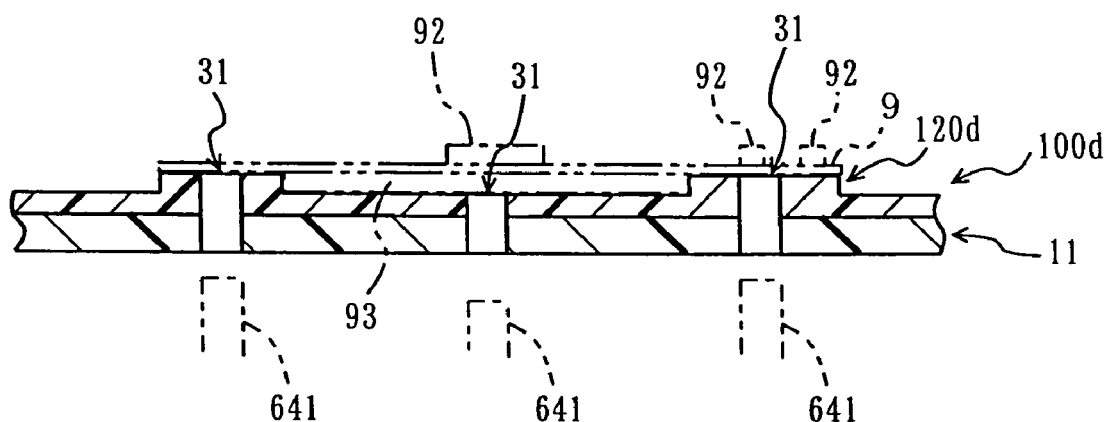
FIG. 35 is a cross-sectional view of a pallet according to a third alternative of the second embodiment of the present invention.
Figure 36:
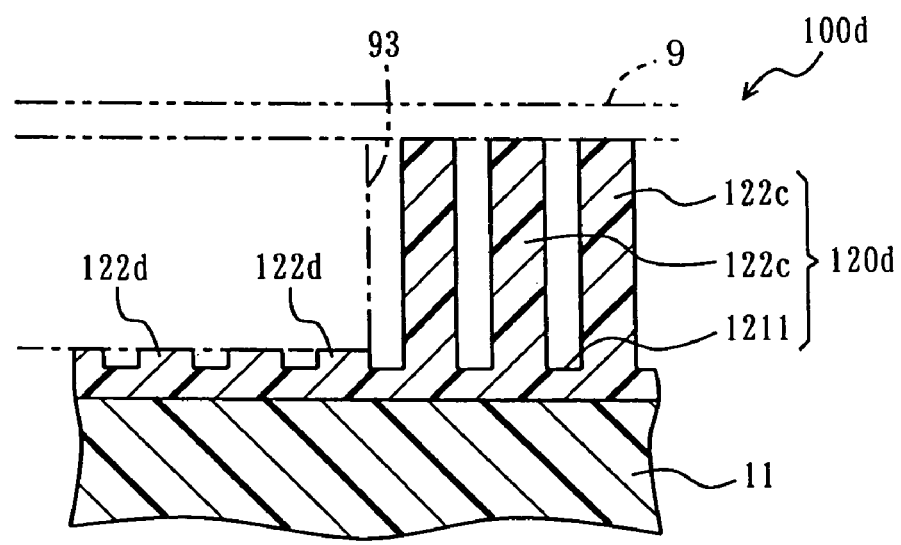
FIG. 36 is a cross-sectional view of the main part of the pallet shown in FIG. 35.

Referring to FIGS. 35 and 36, there is described a pallet 100d which is a third alternative of the substrate holder for carrying an FPC, according to the second embodiment of the present invention. FIG. 35 is a partial vertical cross-sectional view of the pallet 100d. FIG. 36 is an enlarged cross-sectional view of the pallet 100d shown in FIG. 35. The pallet 100d has a base plate 11 and an adhesive section 120d, as with a pallet 100a shown in FIG. 14. In the pallet 100d, as shown in FIG. 36, column-shaped holding elements 122c and 122d having different heights from a flat base surface 1211 protrude from the base surface 1211. That is, substantially, the adhesive section 120d has a height difference. In addition, as shown in FIG. 35, through holes 31 into which push-up pins 641 for peeling are inserted, are appropriately provided so as to penetrate through the base plate 11 and the adhesive section 120d.

As shown in FIG. 35, an FPC 9 to be held onto the pallet 100d has a reinforcement member 93 bonded to the back side thereof which is on the opposite side of a surface where electronic components 92 are mounted (i.e., the surface facing the pallet 100d), and thus is a partially flexible circuit board. The thickness of the reinforcement member 93 is equal to the difference in height between the holding element 122c and the holding element 122d, as shown in FIG. 36, and thus the FPC 9 can be held onto the pallet 100d without being influenced by the reinforcement member 93. In addition, by using the pallet 100d, substantially the entire FPC 9 can be held by adhesion, and thus it is possible to prevent the FPC 9 from peeling off the pallet 100d during mounting of electronic components.

In the pallet 100d too, by holding an FPC 9 by a multitude of holding elements arranged with spaces therebetween, easy peeling is achieved and the influence of the thermal expansion difference between the FPC 9 and the pallet 100d can be accommodated, as with the case of the pallet 100a.

The proportion of the total area of holding elements 122c which allow an FPC 9 to adhere thereto may be different from the proportion of the total area of holding elements 122d which allow a reinforcement member 93 to adhere thereto. For example, in the case where peeling of an FPC 9 during mounting needs to be definitely prevented, a region having a great height difference which corresponds to the perimeter of the FPC 9 (i.e., a region where holding elements 122c are provided) may be formed to have relatively high tackiness. In the case where a reinforcement member 93 is so strongly adhered to an FPC 9 that nicks of push-up pins 641 remain in the FPC 9, a region having a small height difference (i.e., a region where holding elements 122d are provided) may be formed to have low tackiness.

Further, the heights of holding elements from the base surface 1211 are not limited to the above two different heights; the holding elements may have three or more different heights. By selecting the heights of holding elements from various different heights, a circuit board can be appropriately adhered in accordance with its configuration.

The production method for the pallet 100d is the same as that for a pallet 100a, except that holding elements having different heights are formed. In addition, the pallet 100d according to the present alternative can be applied to any of the pallets 1a to 1d according to the foregoing first embodiment.

<Fourth Alternative>

Figure 37:
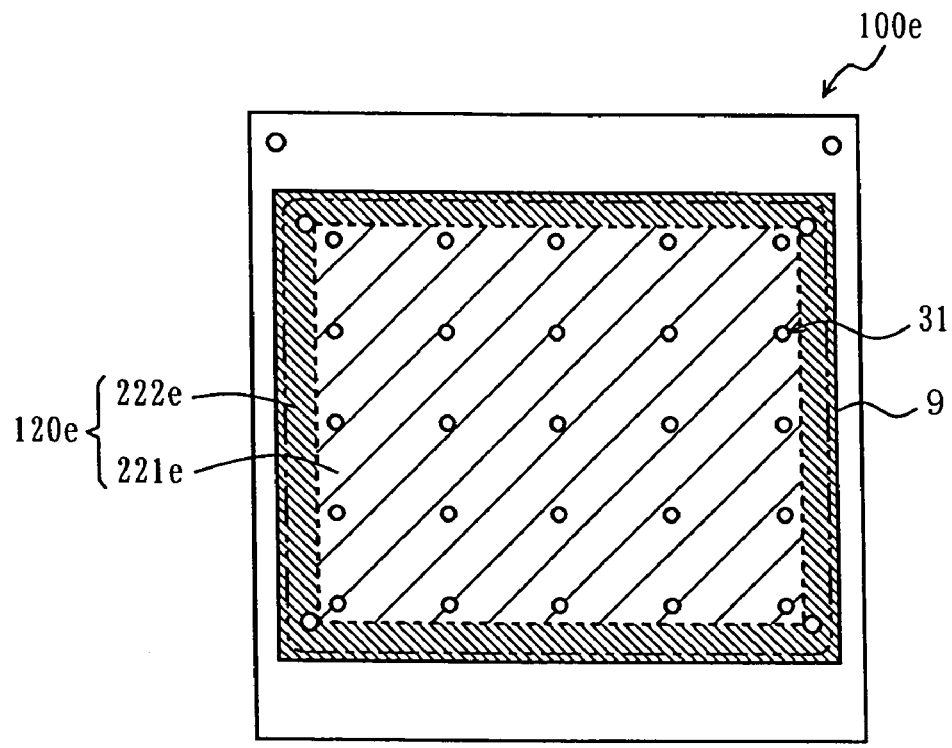
FIG. 37 is a plan view of a pallet according to a fourth alternative of the second embodiment of the present invention.

Referring to FIG. 37, there is described a pallet 100e which is a fourth alternative of the substrate holder for carrying an FPC, according to the second embodiment of the present invention. FIG. 37 is a top view of an FPC-holding surface of the pallet 100e. The pallet 100e is constructed such that in a pallet 100b shown in FIG. 29 an adhesive section 120b is replaced with an adhesive section 120e. Specifically, the relationship between a first holding region 221b and a second holding region 222b of the adhesive section 120b is reversed. More specifically, in the pallet 100e, a second holding region 222e encompasses a first holding region 221e having relatively low tackiness.

In order to avoid strong adhesion of a screen mask onto the pallet 100e when printing solder paste, a peripheral portion of the second holding region 222e where an FPC 9 is not to be adhered is constructed to have minimum tackiness. With the pallet 100e, the possibility of peeling of the perimeter of an FPC 9 off the adhesive section 120e during reflow can be significantly reduced, and the FPC 9 can be treated easily during reflow. Whether to increase or decrease the tackiness of a holding region which corresponds to the perimeter of an FPC 9 (more generally, how a plurality of regions having different proportions of the area of holding surfaces per unit area should be provided) is appropriately determined by the characteristics or processing types of the FPC 9. In addition, the pallet 100e according to the present alternative can be applied to any of the pallets 1a to 1d according to the foregoing first embodiment.

<Fifth Alternative>

Figure 38:
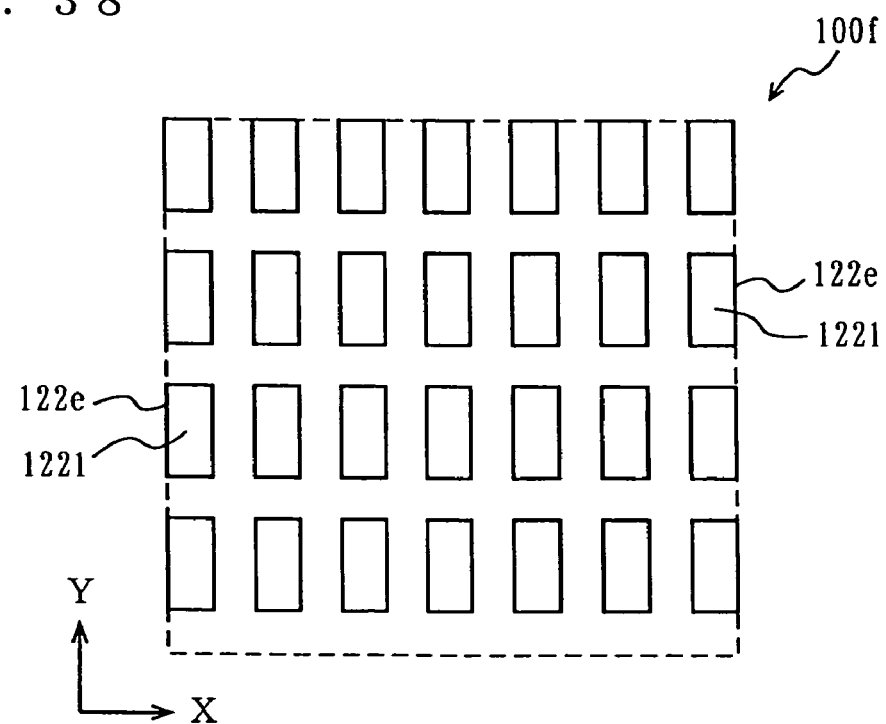
FIG. 38 is a plan view of a pallet according to a fifth alternative of the second embodiment of the present invention.

Referring to FIG. 38, there is described a pallet 100f which is a fifth alternative of the substrate holder for carrying an FPC, according to the second embodiment of the present invention. While holding elements 122, 122a, 122b, 122c, and 122d of the aforementioned pallets 100a to 100e are formed in a column shape, holding elements 122e of the pallet 100f are formed in a prism shape. A holding surface 1221 is a rectangle extending in the Y direction in FIG. 38 (the vertical direction in the figure). Thus, the holding elements 122e have characteristics that they are prone to be deflected in the X direction (in the horizontal direction in the figure) and less prone to be deflected in the Y direction. Accordingly, in the case of holding an FPC which tends to expand in the X direction, for example, the influence of the thermal expansion difference between the pallet and the FPC can be easily accommodated by deflection of holding elements 122e.

In the aforementioned pallets 100a to 100e, the holding elements 122e may be used instead of holding elements 122, 122a, 122b, 122c, and 122d. In addition, the pallet 100f according to the present alternative can be applied to any of the pallets 1a to 1d according to the foregoing first embodiment.

<Sixth Alternative>

Figure 39:
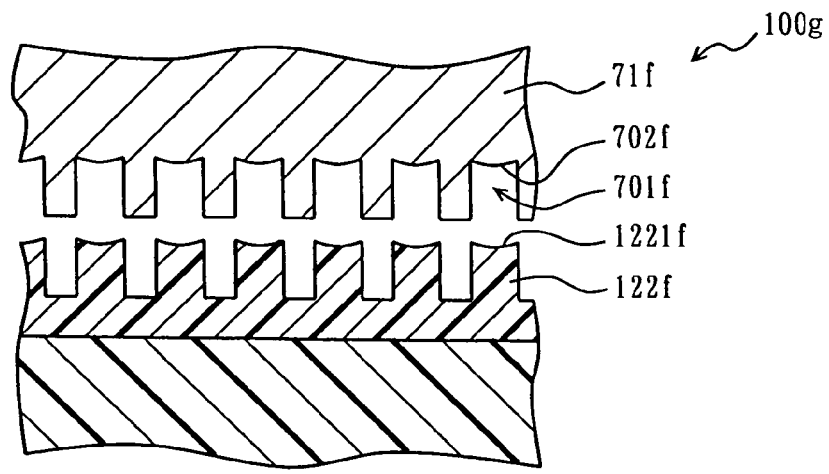
FIG. 39 is a cross-sectional view of a mold and holding elements of a pallet according to a sixth alternative of the second embodiment of the present invention.

Referring to FIG. 39, there is described a pallet 100g which is a sixth alternative of the substrate holder for carrying an FPC, according to the second embodiment of the present invention. Holding elements 122f according to the present alternative are different in shape from any of holding elements 122 and 122a to 122e used in the aforementioned pallets 100a to 100f. Specifically, top-end holding surfaces 1221f of the holding elements 122f are formed to be slightly concave. With this configuration, when an FPC 9 is pressed against the holding elements 122f, the holding surfaces 1221f suck the FPC 9 by the same action as suction cups, and therefore the FPC 9 can be more strongly held. To form the holding elements 122f, bottom surfaces 702f of holes 701f provided in a mold 71f are configured in a convex shape. In the aforementioned pallets 100a to 100f, the holding elements 122f may be used instead of holding elements 122 and 122a to 122e. In addition, the pallet 100g according to the present alternative can be applied to any of the pallets 1a to 1d according to the foregoing first embodiment.

<Seventh Alternative>

Figure 40:
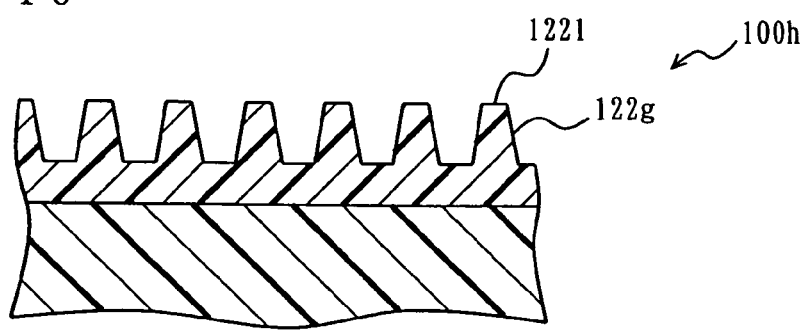
FIG. 40 is a cross-sectional view showing the shape of holding elements of a pallet according to a seventh alternative of the second embodiment of the present invention.

Referring to FIG. 40, there is described a pallet 100h which is a seventh alternative of the substrate holder for carrying an FPC, according to the second embodiment of the present invention. Holding elements 122g according to the present alternative are different in shape from any of holding elements 122 and 122a to 122f used in the aforementioned pallets 100a to 100g. Specifically, the holding elements 122g are formed in a circular cone shape. With this configuration, the area of a single holding surface 1221 can be made smaller than the case of holding elements 122 shown in FIG. 17, and thus tackiness can be reduced without making holding elements excessively thin. Note that the shape of holding elements is not limited to that described above; any shape may be employed as long as the shape allows holding elements to detach from a mold after formation. An example of other shapes includes such a shape that a thin column is stacked on a thick column. In the aforementioned pallets 100a to 100g, the holding elements 122g may be used instead of holding elements 122 and 122a to 122f. In addition, the pallet 100h according to the present alternative can be applied to any of the pallets 1a to 1d according to the foregoing first embodiment.

Figure 41:
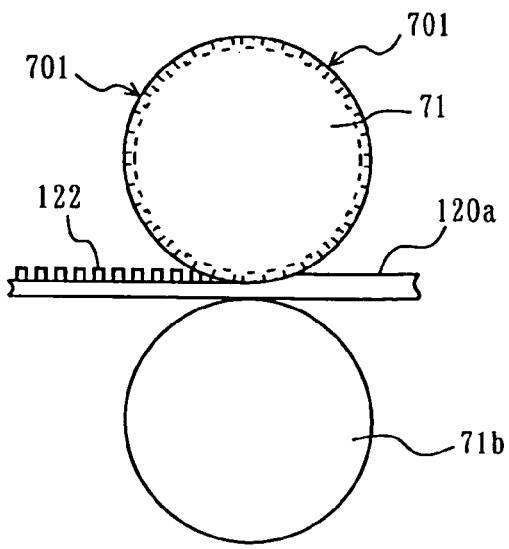
FIG. 41 is a diagram illustrating a method of continuously forming holding elements of the pallet according to the second embodiment of the present invention.

As described above, in the second embodiment, the holding elements 122 and 122a to 122g are formed by pressing a mold 71, such as those shown in FIGS. 26 and 39, vertically against an adhesive material 12M. In another method, as shown in FIG. 41, a mold 71 may be a roller-type mold having a multitude of holes 701 provided therein, and holding elements 122 may be continuously formed by allowing the mold 71 and a counter roller 71b to rotate.

While various embodiments of the present invention have been described above, it is to be understood that the invention is not limited thereto, but on the contrary, various modifications and changes may be made thereto. For example, although a pallet 100 is suitable for holding flexible circuit boards such as those formed of polyimide films or very thin glass epoxy resin, the pallet 100 can also hold plate-like circuit boards having somewhat high stiffness. In addition, holding of a circuit board by adhesion is applied not only to a pallet 100 for carrying a circuit board but also to a holder at various stages of treating a circuit board. Further, the above-described adhesion holding technique can also used in fields other than mounting of electronic components with solder paste, anisotropic conductive resin, or the like; for example, the technique can be used to hold a circuit board while processing the circuit board.

Although in a pallet 100 according to the above-described embodiments, an adhesive material is provided on a base plate 11, it is also possible to form holding elements by processing an adhesive member. For example, holding elements may be formed by providing a multitude of holes in a base plate 11 and inserting column-shaped adhesive materials into the holes, or by affixing a rubber sheet, which is an adhesive material, onto a base plate 11 and forming a multitude of intersecting grooves in the rubber sheet.

Although in a pallet 100b shown in FIGS. 29 and 31, two regions having different tackiness are provided by changing the proportion of the area of holding surfaces of holding elements per unit area, it is also possible to provide three or more regions having different tackiness. In other words, by forming column-shaped holding elements such that at least one holding element has a different diameter from other holding elements, tackiness can be regulated on a region-by-region basis. In general, tackiness can be regulated by adjusting the proportion of the area of holding surfaces per unit area, and thus by forming holding elements such that the holding surface of at least one holding element is different in shape or size from any of other holding elements, tackiness can be regulated.

An object to be held is not limited to a circuit board. In particular, in the case of holding a sheet-like or thin plate-like flexible object (which may be partially flexible), by employing the above-described technique of holding the object with a multitude of holding elements, treatment of the object becomes easy.

While the invention has been described in detail, the foregoing description is in all aspects illustrative and not restrictive. It is understood that numerous other modifications and variations can be devised without departing from the scope of the invention.

What is claimed is:

1. A substrate holder for holding a circuit board onto which a viscous material for bonding electronic components is printed by means of a squeegee through a screen mask, the substrate holder comprising:
   a plate-like main body having a base surface;
   a first holding area provided on the base surface to hold the screen mask;
   a second holding area provided on the base surface to hold the circuit board;
   wherein at least one of the first holding area and the second holding area is arranged to support the squeegee via the screen mask placed on the circuit board such that the squeegee is abutted against the circuit board while the circuit board is held to the second holding area;
   wherein the first holding area includes two first adhesive holding regions having a first tackiness, the first adhesive holding regions being arranged to extend in a first direction and parallel with each other;
   wherein the second holding area includes at least two second adhesive holding regions having a second tackiness which is different from the first tackiness, the second adhesive holding regions being arranged along the first direction and between the two first adhesive holding regions so as to be spaced apart from each other at a predetermined distance; and
   wherein the first direction is a direction in which the squeegee is to be moved to print the viscous material.

2. The substrate holder according to claim 1, wherein the first tackiness is lower than the second tackiness.

3. The substrate holder according to claim 2, wherein the first holding area and the second holding area have the same height from the base surface.

4. The substrate holder according to claim 2, wherein a height of the first holding area from the base surface is greater than a height of the second holding area from the base surface by a value equal to a thickness of the circuit board.

5. The substrate holder according to claim 1, wherein the substrate holder is used as a pallet for carrying the circuit board.

6. A substrate holder for holding a circuit board onto which a viscous material for bonding electronic components is printed by means of a squeegee through a screen mask, the substrate holder comprising:
   a plate-like main body having a base surface;
   a first holding area provided on the base surface to hold the screen mask;
   a second holding area provided on the base surface to hold the circuit board;
   wherein at least one of the first holding area and the second holding area is arranged to support the squeegee via the screen mask placed on the circuit board such that the squeegee is abutted against the circuit board while the circuit board is held to the second holding area;
   wherein the first holding area includes at least two first adhesive holding regions having a first tackiness and arranged along a first direction so as to be spaced apart from each other at a first predetermined distance;
   wherein the second holding area includes at least two second adhesive holding regions having a second tackiness which is different from the first tackiness, the second adhesive holding regions being arranged along the first direction and alternately with the first adhesive holding regions, so as to be spaced apart from each other at a second predetermined distance; and
   wherein the first direction is a direction in which the squeegee is to be moved to print the viscous material.

7. The substrate holder according to claim 6, wherein the first adhesive holding regions and the second adhesive holding regions are of substantially the same length in a second direction which is perpendicular to the first direction.

8. The substrate holder according to claim 6, wherein the first tackiness is lower than the second tackiness.

9. The substrate holder according to claim 8, wherein the first holding area and the second holding area have the same height from the base surface.

10. The substrate holder according to claim 8, wherein a height of the first holding area from the base surface is greater than a height of the second holding area from the base surface by a value adapted to be equal to a thickness of the circuit board.

11. The substrate holder according to claim 6, wherein the substrate holder is used as a pallet for carrying the circuit board.

12. A substrate holder for holding a circuit board onto which a viscous material for bonding electronic components is printed by means of a squeegee through a screen mask, the substrate holder comprising:
   a plate-like main body having a base surface;
   a first holding area provided on the base surface to hold the screen mask;
   a second holding area provided on the base surface to hold the circuit board;
   wherein at least one of the first holding area and the second holding area is arranged to support the squeegee via the screen mask placed on the circuit board such that the squeegee is abutted against the circuit board while the circuit board is held to the second holding area;
   wherein the first holding area extends in a first direction by a first predetermined distance;
   wherein the second holding area includes
   two side portions extending in parallel with each other in a second direction which is perpendicular to the first direction so as to be spaced apart from each other at a second predetermined distance which is smaller than the first predetermined distance, and each having a first end portion parallel with the first direction, at least a part of each of the first end portions being close to the first holding area, and
   a central portion extending in the first direction and between the two side portions so as to be parallel with and spaced apart from the first holding area; and
   wherein the first direction is a direction in which the squeegee is to be moved to print the viscous material.

13. The substrate holder according to claim 12, wherein the first holding area has a first tackiness and the second holding area has a second tackiness which is higher than the first tackiness.

14. The substrate holder according to claim 13, wherein the first holding area and the second holding area have the same height from the base surface.

15. The substrate holder according to claim 13, wherein a height of the first holding area from the base surface is greater than a height of the second holding area from the base surface by a value adapted to be equal to a thickness of the circuit board.

16. The substrate holder according to claim 12, wherein the substrate holder is used as a pallet for carrying the circuit board.

17. A substrate holder for holding a circuit board onto which a viscous material for bonding electronic components is printed by means of a squeegee though a screen mask, the substrate holder comprising:
 a plate-like main body having a base surface;
 a first holding area provided on the base surface to hold the screen mask;
 a second holding area provided on the base surface to hold the circuit board;
 wherein at least one of the first holding area and the second holding area is arranged to support the squeegee via the screen mask placed on the circuit board such that the squeegee is abutted against the circuit board while the circuit board is held to the second holding area;
 wherein the first holding area, the second holding area, and the base surface are formed integrally with an adhesive material; and
 wherein the first holding area includes at least a first adhesive holding region having a first tackiness, and the second holding area includes at least a second adhesive holding region having a second tackiness which is different from the first tackiness.

18. The substrate holder according to claim 17, wherein the first holding area has a plurality of first holding elements protruding from the base surface,
 the second holding area has a plurality of second holding elements protruding from the base surface, and
 top ends of the first holding elements and the second holding element are formed in a shape selected from the group consisting of flat and concave shapes.

19. The substrate holder according to claim 18, wherein the first and second holding elements have the same height from the base surface.

20. The substrate holder according to claim 18, wherein heights of the first and second holding elements from the base surface are selected from a plurality of heights.

21. The substrate holder according to claim 18, wherein the top ends of the first and second holding elements have the same shape.

22. The substrate holder according to claim 21, wherein each of the first and second holding elements has a column shape.

23. The substrate holder according to claim 22, wherein at least one of the first and second holding elements has a diameter different from any of the rest of the holding elements.

24. The substrate holder according to claim 18, wherein the top ends of the first and second holding elements are different in size of their shapes.

25. The substrate holder according to claim 18, wherein the top ends of the first and second holding elements have different shapes.

26. The substrate holder according to claim 18, wherein the top ends of the second holding elements have two different sizes of shapes.

27. The substrate holder according to claim 18, wherein a proportion of a total top-end area of the holding elements per unit area in the second holding area is different from a proportion of a total top-end area of the holding elements in the first holding area.

28. The substrate holder according to claim 18, wherein
 the circuit board to be held has a width in a range of 10 mm to 350 mm, and
 the holding elements are formed with the adhesive material so as to have a height in a range of 0.1 mm to 5 mm.

29. The substrate holder according to claim 18, wherein
 the circuit board to be held has a width in a range of 10 mm to 350 mm, and
 the holding elements are formed with the adhesive material so as to have a column shape with a diameter in a range of 1 mm to 30 mm.

30. The substrate holder according to claim 17, wherein the adhesive material is selected from the group consisting of silicon rubber and polyurethane rubber.

31. The substrate holder according to claim 17, wherein the second holding area is encompassed in the first holding area.

32. The substrate holder according to claim 17, wherein the first holding area is formed in combination with a plurality of the second holding areas, on the base surface.

33. The substrate holder according to claim 17, wherein the main body has a plurality of through holes provided therein into which pins are to be inserted.

34. The substrate holder according to claim 17, wherein the substrate holder is used as a pallet for carrying the circuit board.

35. A method of producing a substrate holder for use in holding a circuit board onto which a viscous material for bonding electronic components is printed by means of a squeegee through a screen mask, the method comprising
 placing an adhesive material on a plate-like main body,
 heating a mold having a plurality of holes whose bottom surfaces have a shape selected from the group consisting of flat and convex shapes, and pressing the mold against the adhesive material until the adhesive material reaches the bottom surfaces, and
 removing the mold from the adhesive material after the mold has been cooled,
 wherein the substrate holder produced comprises:
 the plate-like main body having a base surface;
 a first holding area provided on the base surface to hold the screen mask;
 a second holding area provided on the base surface to hold the circuit board;
 wherein at least one of the first holding area and the second holding area is arranged to support the squeegee via the screen mask placed on the circuit board such that the squeegee is abutted against the circuit board while the circuit board is held to the second holding area;
 wherein the first holding area, the second holding area, and the base surface are formed integrally with an adhesive material;
 wherein the first holding area includes at least a first adhesive holding region having a first tackiness, and the second holding area includes at least a second adhesive holding region having a second tackiness which is different from the first tackiness;

wherein the first holding area has a plurality of first holding elements protruding from the base surface;

wherein the second holding area has a plurality of second holding elements protruding from the base surface; and wherein top ends of the first holding elements and the second holding element are formed in a shape selected from the group consisting of flat and concave shapes.

36. The method of producing the substrate holder according to claim 35, wherein the adhesive material is selected from the group consisting of silicon rubber and polyurethane rubber.

37. The method of producing the substrate holder according to claim 36, wherein in said heating and pressing of the mold, vulcanization is performed.

* * * * *